US012651640B2

(12) United States Patent
Riho et al.

(10) Patent No.: US 12,651,640 B2
(45) Date of Patent: Jun. 9, 2026

(54) SYSTEM ERROR CORRECTION CODE (ECC) CIRCUITRY ROUTING

(71) Applicant: Micron Technology, Inc., Boise, ID (US)

(72) Inventors: Yoshiro Riho, Boise, ID (US); Hyun Yoo Lee, Boise, ID (US); Yang Lu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 126 days.

(21) Appl. No.: 18/511,440

(22) Filed: Nov. 16, 2023

(65) Prior Publication Data

US 2024/0170091 A1 May 23, 2024

Related U.S. Application Data

(60) Provisional application No. 63/384,285, filed on Nov. 18, 2022.

(51) Int. Cl.
*G11C 29/52* (2006.01)
*G11C 7/08* (2006.01)
*G11C 7/10* (2006.01)
(52) U.S. Cl.
CPC ................ *G11C 29/52* (2013.01); *G11C 7/08* (2013.01); *G11C 7/1039* (2013.01)

(58) Field of Classification Search
CPC ........... G11C 29/52; G11C 29/42; G11C 7/08; G11C 7/1039; G11C 2029/0411; G06F 11/1048
See application file for complete search history.

(56) References Cited

U.S. PATENT DOCUMENTS

| | | | |
|---|---|---|---|
| 6,510,537 B1 * | 1/2003 | Lee ..................... | G06F 11/1008 714/763 |
| 2014/0245105 A1 * | 8/2014 | Chung .................. | G06F 3/0604 714/763 |
| 2022/0108762 A1 * | 4/2022 | Jang ..................... | G11C 29/42 |

* cited by examiner

*Primary Examiner* — Sultana Begum
(74) *Attorney, Agent, or Firm* — Colby Nipper PLLC

(57) ABSTRACT

Described apparatuses and methods provide system error correction code (ECC) circuitry routing that segregates even sense amp (SA) line data sets and odd SA line data sets in a memory, such as a low-power dynamic random-access memory. A memory device may include one or more dies, and a die can have even SA line data sets and odd SA line data sets. The memory device may also include ECC circuitry comprising one or more ECC engines. By segregating the data sets, instead of coupling even and odd SA line data sets to a single ECC engine, double-bit errors on a single word line may be separated into two single-bit errors. Thus, by utilizing system ECC circuitry routing in this way, even a one-bit ECC algorithm may be used to correct double bits, which may increase data reliability.

20 Claims, 10 Drawing Sheets 400-1

400-2

800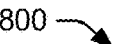

Receive respective data sets for a pair of SA lines that
comprise an even SA line data set and an odd SA line data set

802

Provide the even SA
line data set to a
first ECC engine

804

Provide the odd SA
line data set to a
second ECC engine

806

Receive a first ECC
determination from the first
ECC engine

808

Receive a second ECC
determination from the second
ECC engine

810

Correct a bit error in the even
SA line data set based on the
first ECC determination

812

Correct a bit error in the odd
SA line data set based on the
second ECC determination

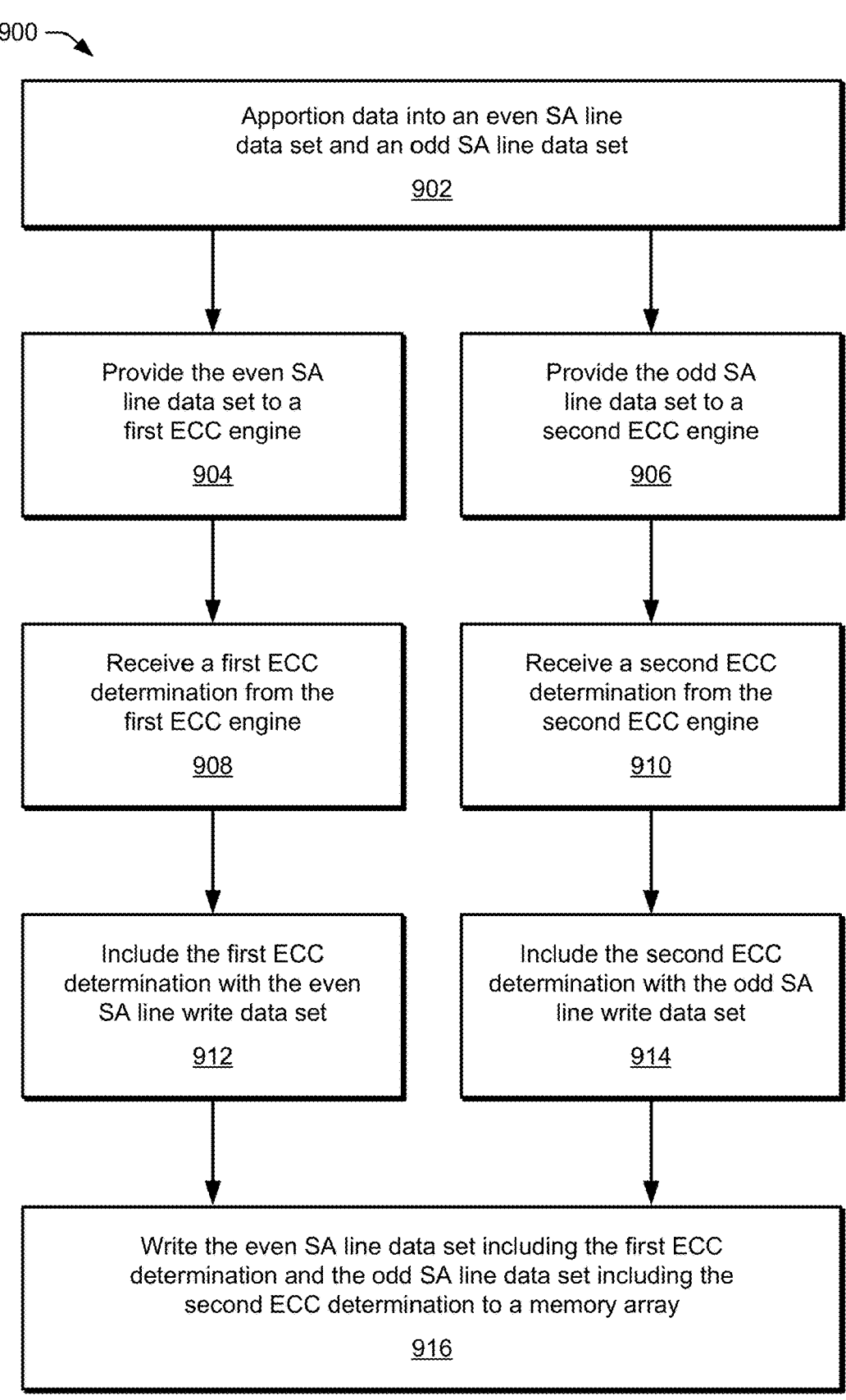

Apportion data into an even SA line
data set and an odd SA line data set

902

Provide the even SA
line data set to a
first ECC engine

904

Provide the odd SA
line data set to a
second ECC engine

906

Receive a first ECC
determination from the
first ECC engine

908

Receive a second ECC
determination from the
second ECC engine

910

Include the first ECC
determination with the even
SA line write data set

912

Include the second ECC
determination with the odd SA
line write data set

914

Write the even SA line data set including the first ECC
determination and the odd SA line data set including the
second ECC determination to a memory array

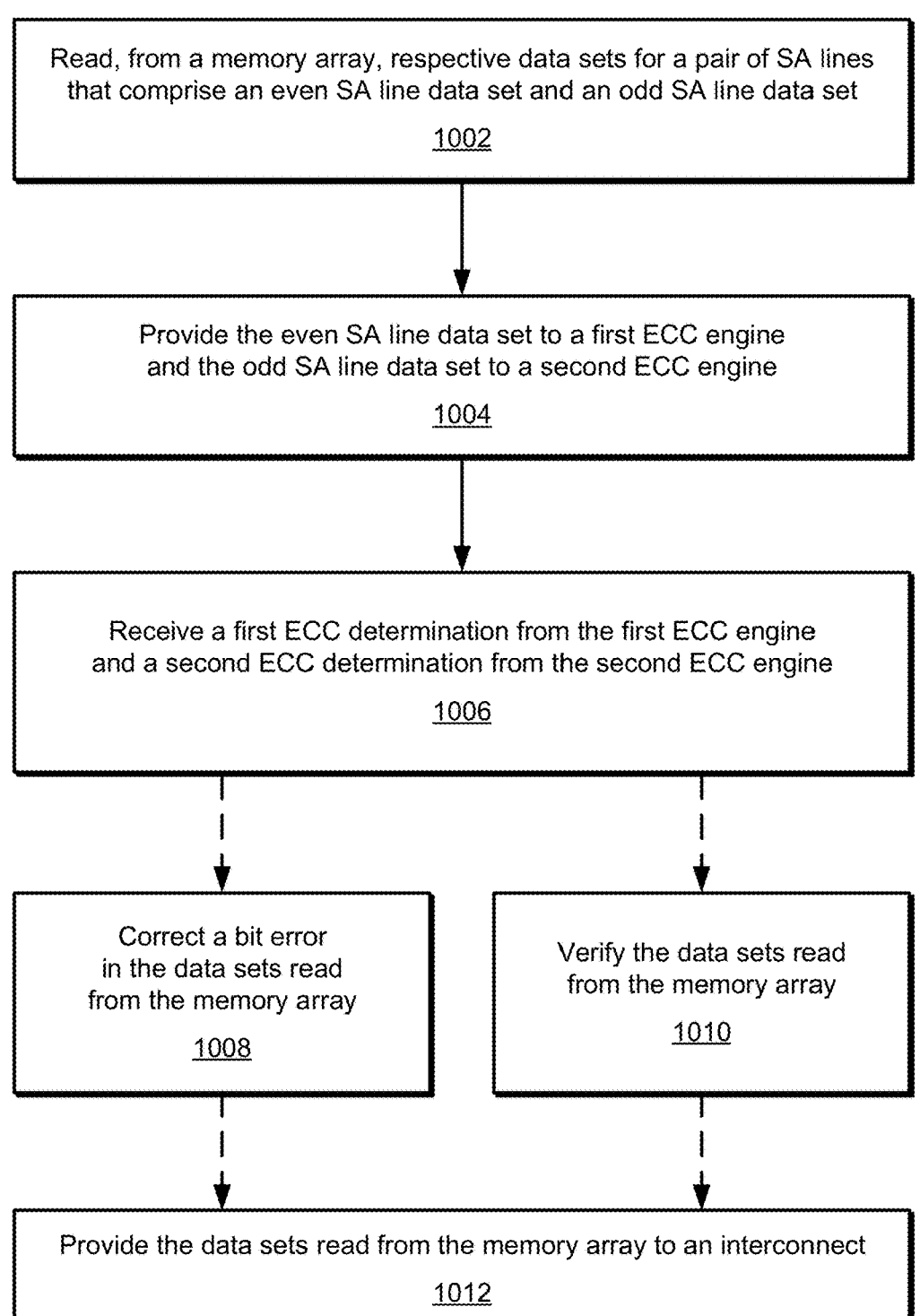

Read, from a memory array, respective data sets for a pair of SA lines
that comprise an even SA line data set and an odd SA line data set

1002

Provide the even SA line data set to a first ECC engine
and the odd SA line data set to a second ECC engine

1004

Receive a first ECC determination from the first ECC engine
and a second ECC determination from the second ECC engine

1006

Correct a bit error
in the data sets read
from the memory array

1008

Verify the data sets read
from the memory array

1010

Provide the data sets read from the memory array to an interconnect

SYSTEM ERROR CORRECTION CODE (ECC) CIRCUITRY ROUTING

CROSS-REFERENCE TO RELATED APPLICATION(S)

This application claims priority to U.S. Provisional Patent Application Ser. No. 63/384,285 filed on Nov. 18, 2022, the disclosure of which is incorporated by reference herein in its entirety.

BACKGROUND

Computers, smartphones, and other electronic devices utilize processors and memories. A processor executes code based on data to run applications and provide features to a user. The processor obtains the code and the data from a memory. Like the number of cores or the clock speed of a processor, characteristics of a memory can impact the performance of an electronic device. Different types of memory have different characteristics: for example, volatile memory (e.g., dynamic random-access memory (DRAM)) cannot retain data without power, and non-volatile memory (e.g., flash memory) can retain data without power.

Demands on different types of memory continue to evolve and grow. For example, as processors are engineered to execute code faster, they can benefit from obtaining data more quickly from a faster memory. Applications may also operate on ever larger data sets that demand ever larger memories. Further, in some applications such as financial services or automotive assistance systems, there exists a demand for more reliable memories. Thus, accommodating these various demands is complicated by the diverse strengths and capabilities of different types of memories.

BRIEF DESCRIPTION OF THE DRAWINGS

Apparatuses of and techniques for system error correction code (ECC) circuitry routing are described with reference to the following drawings. The same numbers are used throughout the drawings to reference like features and components:

FIG. 8 illustrates an example method for error correction with system ECC circuitry routing:

FIG. 9 illustrates an example method for writing data of even SA lines and odd SA lines to a memory array; and FIG. 10 illustrates an example method for reading data of even SA lines and odd SA lines.

DETAILED DESCRIPTION

Overview

Figure 1:
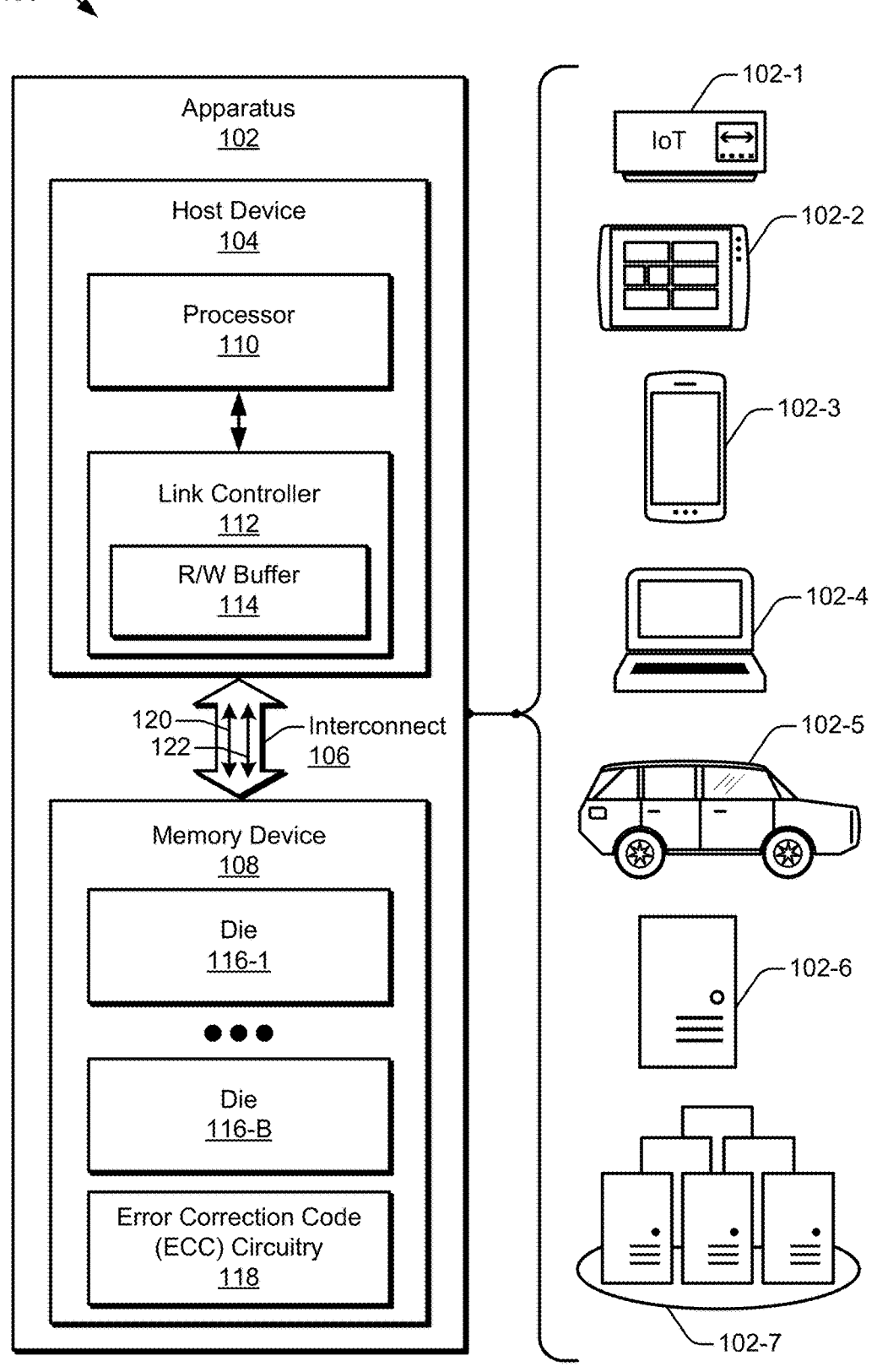
FIG. 1 illustrates example apparatuses in which aspects of system ECC circuitry routing can be implemented.

Processors and memory work in tandem to provide features to users of computers and other electronic devices. As processors and memory operate more quickly together in a complementary manner, an electronic device can provide enhanced features, such as high-resolution graphics and artificial intelligence (AI) analysis. Some applications, such as those for financial services, medical devices, and advanced driver assistance systems (ADAS), can also demand more reliable memories. These applications use increasingly reliable memories to limit errors in financial transactions, medical decisions, and object identification. However, in some implementations, more reliable memories can sacrifice bit densities, power efficiency, and simplicity.

To enable more reliable memories, engineers strive to improve process capabilities, such as more consistent fabrication of components (e.g., active areas, word lines, bit lines) at a minimum feature size, more robust chemical compositions, and more reliable power delivery. However, process capabilities can only achieve so much, especially as the minimum feature size of memory components decreases. Accordingly, memories have evolved to incorporate memory protection circuitry including error correction code (ECC) engines. ECC engines are described further below after some example memory types are introduced.

There are many types of DRAM, including synchronous DRAM (SDRAM). Low-power double data rate (DDR) SDRAM, which is sometimes referred to as LPDDR or mobile DRAM, can use less power than other types of DDR SDRAM. Accordingly, device manufacturers often choose LPDDR memory for use in mobile devices such as smartphones, tablets, and laptops. In some applications. LPDDR memory operates at higher data rates than other types of DDR SDRAM. Increasingly, cloud financial service and automotive assistance system companies use LPDDR memory in server applications to reduce electricity usage and, therefore, lower operational costs across large data centers. Designing LPDDR memory for different use cases and applications, however, is challenging.

LPDDR memory may include memory protection circuitry including an ECC engine. The ECC engine may be a 1-bit ECC (ECC1) engine capable of single-bit error correction (SEC) and double-bit error detection (DED) or a 2-bit ECC (ECC2) engine capable of double-bit error correction (DEC) and triple-bit error detection (TED). The ECC engine may also be an N-bit ECC engine capable of N-bit error correction and N+1-bit error detection, where N is a whole number greater than or equal to one. The type of ECC engine an LPDDR manufacturer chooses to implement may be restricted by design considerations, such as the size and shape of the LPDDR memory. Some features supported by LPDDR architecture can restrict design flexibility by, for example, occupying additional die space or requiring additional components or logic, such as additional or redundant ECC engines.

Nonetheless, on-die mechanisms to increase reliability for DDR SDRAM, including LPDDR SDRAM, can be improved by implementing error-correction logic. Error-correction logic can be implemented by employing an ECC engine that determines ECC values for data portions (e.g., a byte, some quantity of bytes). As electronic devices and systems become more powerful to handle ever larger data sets at ever-increasing data rates, improvements in memory reliability become more important to users, hardware engineers, and application designers. Some more capable implementations of error-correction logic, including ECC2 and ECC3, can increase on-die reliability coverage for an LPDDR memory. However, such implementations may demand more power or die area, increase signal routing complexity, and reduce signal integrity on an LPDDR die.

To address these issues at least partially, in some implementations, an ECC engine is shared across multiple banks of a multi-banked memory or shared across multiple dies of a multi-die memory device. In such implementations, the ECC engine can provide memory protection functionality to two or more memory banks of the multiple memory banks of a die or to two or more dies of the multiple dies of a memory device. For example, an ECC engine can perform ECC determinations (e.g., computations) for data stored in multiple memory locations (e.g., banks of a die, dies of a device). In operation, the ECC engine determines a first ECC value based on first data that is stored in a first memory location, and the ECC engine also determines a second ECC value based on second data that is stored in a second memory location. This determination avoids at least some replication of memory protection circuitry, including replication of ECC engines. By omitting instances of ECC engines. ECC engines that use more than one bit (e.g., ECC2 engines) can be employed in a memory device. With multibit ECC engines, higher levels of error detection or correction can be implemented to provide greater data reliability than per-memory-bank or per-die ECC approaches provide.

However, in some cases, the architecture, protocols, features, or design goals of an LPDDR die can restrict the die area allocated for an ECC engine. In such cases, often an ECC1 engine is used because it is the smallest of the ECC engines. For example, a maximized array efficiency (AE) is often a design goal for memory manufacturers. The AE is a ratio of die area allocated to the array (e.g., data bits) versus the total die area. The total die area includes the array, where rows (e.g., word lines) and columns (e.g., bit lines) intersect at memory cells (e.g., where data bits are stored), and supporting circuitry (e.g., row decoders, column decoders, voltage regulators. ECC engines). If a memory manufacturer incorporates a multibit ECC engine, more of the total die area is allocated to the multibit ECC engine and, therefore, less of the total die area is allocated to the array, decreasing the AE of the die. Not uncommonly, and specifically as process improvements are honed and bit errors become less common, an ECC1 engine is sufficient to meet the design goals of an LPDDR die. To a same end, the ECC1 engine is often connected (e.g., electrically) to a respective memory block (e.g., array, die) through the most direct routing possible. This reduces routing complexity and therefore access delays and power demand (e.g., through reduced resistance and capacitance).

Typically, as minimum feature sizes shrink in pursuit of larger bit densities, ever-shrinking memory cells become more difficult to manufacture, especially consistently. In some cases, one or more adjacent memory cells may be manufactured with a defect, resulting in a misshapen memory cell or a memory cell with conductive material, for example, where insulating material should be. In such cases, adjacent memory cells may be electrically shorted together, meaning they can only ever store the same data (e.g., a logical one or zero). This type of defect can result in a double-bit error. Additionally, as indicated above, an ECC1 engine is often connected to a memory block via a simple, direct route. This means that the ECC1 engine is often connected to both memory cells of a double-bit error. Accordingly, the ECC1 engine can detect a double-bit error but not correct the double-bit error.

This document describes aspects of system ECC circuitry routing, which may enable the use of one-bit ECC engines to detect and/or correct double-bit errors. In various aspects, system ECC circuitry is routed to provide a first bit from a double-bit error to a first ECC1 engine and a second bit from the double-bit error to a second ECC 1 engine. In such aspects, a double-bit error is effectively split into two single-bit errors, which can be corrected by the first and second ECC1 engines. The first and second ECC1 engines may be implemented in a multi-bank die, where the engines provide ECC determinations for multiple memory banks, or in a multi-die memory device, where the engines provide ECC determinations for multiple dies. In implementations, first and second ECC1 engines can be incorporated into a controller on a memory device.

Described apparatuses and methods provide system error correction code (ECC) circuitry routing that segregates even sense amp (SA) line data sets and odd SA line data sets in a memory, such as a low-power dynamic random-access memory. A memory device may include one or more dies, and a die can have even SA line data sets and odd SA line data sets. The memory device may also include ECC circuitry comprising one or more ECC engines. By segregating the data sets, instead of coupling even and odd SA line data sets to a single ECC engine, double-bit errors on a single word line may be separated into two single-bit errors. Thus, by utilizing system ECC circuitry routing in this way, even a one-bit ECC algorithm may be used to correct double bits, which may increase data reliability and reduce die area.

A memory device may have an interconnected die architecture (e.g., a stacked or linked die architecture). This architecture uses at least one set of interconnected dies, including at least one interface die connected "internally" to at least one linked die within a package that houses two or more dies. The multiple dies can be coupled to a controller, such as a memory controller including an ECC engine, via an interconnect that includes a command bus and a data bus. In some cases, the interface die and the linked die share access to the command bus while the interface die has "direct" access to the data bus. The linked die, however, communicates with the data bus "indirectly" via the interface die and can therefore use a second data bus to communicate with the interface die.

A memory device such as the one described above can be secured to a printed circuit board (PCB), such as a rigid or flexible motherboard. The PCB can include sockets for receiving at least one processor and one or more memory devices. Wiring infrastructure can be disposed on at least one layer of the PCB, enabling communication between two or more components. Some PCBs include multiple sockets that are each shaped as a linear slot designed to accept a dual in-line memory module (DIMM) (e.g., a memory device). These sockets can be fully occupied by DIMMs while a processor is still able to utilize additional memory. In such situations, the system is capable of greater performance if additional memory is available to the processor.

PCBs may also include at least one peripheral component interconnect express (PCIe®) slot. A PCIe slot is designed to provide a common interface for various types of components that may be coupled to a PCB. The PCIe protocol can provide higher rates of data transfer, smaller footprints, or both to the PCB compared to some other standards. Accordingly, certain PCBs enable a processor to access a memory device that is connected to the PCB via a PCIe slot.

In implementations, accessing a memory solely using a PCIe protocol may not offer a desired functionality or reliability. In such implementations, another protocol may be layered on top of the PCIe protocol. As an example, one higher-level protocol is the Compute Express Link™ (CXL) protocol. The CXL protocol can be implemented over a physical layer that is governed by, for example, the PCIe protocol. The CXL protocol can provide a memory-coherent interface capable of high-bandwidth or low-latency data transfers or data transfers with both conditions.

The CXL protocol addresses some of the limitations of PCIe links by providing an interface that leverages, for example, the PCIe 5.0 physical layer while providing lower-latency paths for memory access and coherent caching between processors and memory devices. The CXL protocol can offer high-bandwidth, low-latency connectivity between a host device (e.g., a processor, central processing units (CPUs), a system-on-a-chip (SoC)) and memory devices (e.g., DIMMs, accelerators, memory expanders). The CXL protocol also addresses growing high-performance computational workloads by supporting diverse processing and memory systems with potential applications in AI, machine learning (ML), ADAS, and other high-performance computing environments. With the potential to increase memory density by utilizing improved communications protocols such as CXL, memory devices may be specified with additional design constraints that create new challenges for designers of memory devices.

The many different formats of memory, such as an LPDDR5 DIMM or a CXL memory module, may include multiple dies. The multiple dies that are packaged together may form a memory device with an interconnected die architecture. An interconnected-die memory device includes at least one set of interconnected dies, such as an interface die and at least one linked die. Although described herein primarily in terms of interconnected dies that are packaged together, interconnected dies may instead be packaged separately. The interface die can "directly" send data to or receive data from a memory controller or other component over a data bus of an interconnect. In contrast, the linked die "indirectly" sends data to or receives data from the memory controller or other component through the interface die using a second bus, which may be a data bus internal to a package enclosing the two or more dies. In other words, the interface die acts as an interface with respect to data being transmitted and received between the linked die and the memory controller on a data bus that couples the interface die and the memory controller. The interface and linked dies may share joint access to a command bus, an address bus, or a combination thereof. Additionally or alternatively, the interface die may act as an interface for the linked die with respect to a command/address (C/A) bus that propagates command information, address information or both. In some of such cases, the two dies may share joint access to an external data bus.

Although some implementations are described herein in terms of a CXL memory module, the memory module can be any memory module, such as a single in-line memory module (SIMM), a DIMM, or another memory device. Further, although some implementations are described herein in terms of at least one ECC engine, there can be any number of ECC engines, including one, two, three, four, and so forth. The ECC engines can be one-bit or multibit ECC engines, depending on design considerations for the given memory device.

6

Example Operating Environments

FIG. 1 illustrates, at 100 generally, example apparatuses 102 in which aspects of system error correction code (ECC) circuitry routing can be implemented. The apparatus 102 can be, for example, at least one electronic device. Example implementations of an electronic device include an internet-of-things (IoT) device 102-1, a tablet 102-2, a smartphone 102-3, a notebook computer 102-4 (or desktop computer), a passenger vehicle 102-5, a server computer 102-6, a server cluster 102-7 that may be part of cloud computing infrastructure or a data center, and a portion thereof (e.g., a PCB). Other examples of the apparatus 102 include a smartwatch, a video dongle, a smart television, a gaming device, a motherboard, a consumer appliance (e.g., a washing machine), a vehicle, a drone, industrial equipment, a security device, and so forth. Each type of electronic device or other apparatus can include one or more components to provide some computing functionality or feature.

In implementations, the apparatus 102 can include a host device 104, an interconnect 106, and a memory device 108 operably coupled to the host device 104 via the interconnect 106. The host device can include a processor 110 and a link controller 112 with a read/write (R/W) buffer 114. The memory device 108 may include, for example, a CXL module, a DRAM die or module, including a three-dimensional (3D) stacked DRAM device, such as a high-bandwidth memory (HBM) device or a hybrid memory cube (HMC) device. The memory device 108 may operate as the main memory for a system including, for example, the host device 104. In aspects, the memory module 108 is formed from multiple memory dies 116-1 through 116-B and error correction code (ECC) circuitry 118, examples of which are described throughout this disclosure. Although not shown, the apparatus 102 can include storage, such as a solid-state drive (SSD), a hard disk drive (HDD), a flash memory, or another form of non-volatile memory.

As shown in FIG. 1, the processor 110 of the host device 104 may be coupled to the link controller 112. In aspects, the host device 104 may include other components (not shown) to provide various functionalities of the host device 104. In some cases, the processor 110 and other components of the host device 104 form an integrated system (e.g., an SoC). The processor 110 may include or comprise a general-purpose processor, a CPU, a graphics processing unit (GPU), a neural network engine or accelerator, an application-specific integrated circuit (ASIC), a field-programmable gate array (FPGA), an integrated circuit (IC), a modem or baseband processor, and the like. In operation, the link controller 112 can provide a high-level or logical interface between the processor 110, other memories coupled to the link controller (not shown), and at least one external device (e.g., the memory device 108). The link controller 112 can, for example, receive communication requests from the processor 110 and provide them to the external device with appropriate formatting, timing, reordering, and so forth. The link controller 112 can also forward to the processor 110 responses to the communication requests that the link controller 112 receives from the external device.

Regarding connections to the host device 104, the host device can be coupled to the memory device 108 via the interconnect 106. The memory device 108 may, although not shown, be coupled to a storage memory. The host device 104 can also be coupled, directly or indirectly, to the memory device 108 and the storage memory via the interconnect 106. The depicted interconnect 106, as well as other interconnects not shown that communicatively couple together various components, enables data to be transferred between two or more components of the various components. Examples of the interconnect 106 include a bus, a switching fabric, a crossbar, a relay, one or more conductors that carry a voltage or a current signal, and the like. The interconnect can include at least one C/A bus 120 and a data input/output (DQ) bus 122. Each bus may be implemented as a unidirectional or bidirectional bus. Although not shown, the interconnect 106 may also include a clock bus that is part of or separate from the C/A bus 120. The C/A and DQ buses 120 and 122 may be coupled to C/A and DQ pins, respectively, of the memory device 108.

Although various implementations of the apparatus 102 are depicted in FIG. 1 and described herein, the apparatus 102 can be implemented in alternative manners. For example, the host device 104 may include multiple cache memories (not shown), including multiple levels of cache memory, or may have no cache memory. In some cases, the host device 104 may omit the processor 110 or the link controller 112. A memory, such as the memory device 108, may have a respective "internal" or "local" cache memory (not shown). Generally, the illustrated and described components may be implemented in alternative ways, including in distributed or shared memory systems. A given apparatus 102 may also include more, fewer, or different components.

The host device 104 and the various external devices, such as the memory device 108, may be realized in multiple manners. In some cases, the host device 104 and the memory device 108 can both be disposed on, or physically supported by, one PCB (e.g., a rigid or flexible motherboard). The host device 104 and the memory device 108 may additionally be integrated on one IC or fabricated on separate ICs but packaged together. The memory device 108 or another external device may also be coupled to multiple host devices 104 via one or more interconnects 106 and may be able to respond to communication requests from two or more of the host devices 104. Each host device 104 may include a respective link controller 112, or the multiple host devices 104 may share a common link controller 112. An example computing system architecture with at least one host device 104 that is coupled to a memory device 108 is described below with reference to FIG. 2.

The electrical paths or couplings realizing the interconnect 106 can be shared between two or more memory components (e.g., modules, dies, banks, or bank groups). In some implementations, the C/A bus 120 is used for transmitting addresses and commands from the link controller 112 to the memory device 108, and this transmission may be to the exclusion of propagating data. The DQ bus 122 can propagate data between the link controller 112 and the memory device 108. The memory device 108 may include or be configured with multiple memory banks (not shown in FIG. 1). The memory device 108 may be realized with any suitable memory and/or storage facility, including but not limited to DRAM, SDRAM, 3D stacked DRAM, DDR memory, LPDDR DRAM, and LPDDR SDRAM. The memory device 108 may be described in terms of forming at least part of a main memory of the apparatus 102. The memory device 108 may, however, form at least part of a cache memory, a storage memory, an SoC, and so forth of an apparatus 102.

Figure 2:
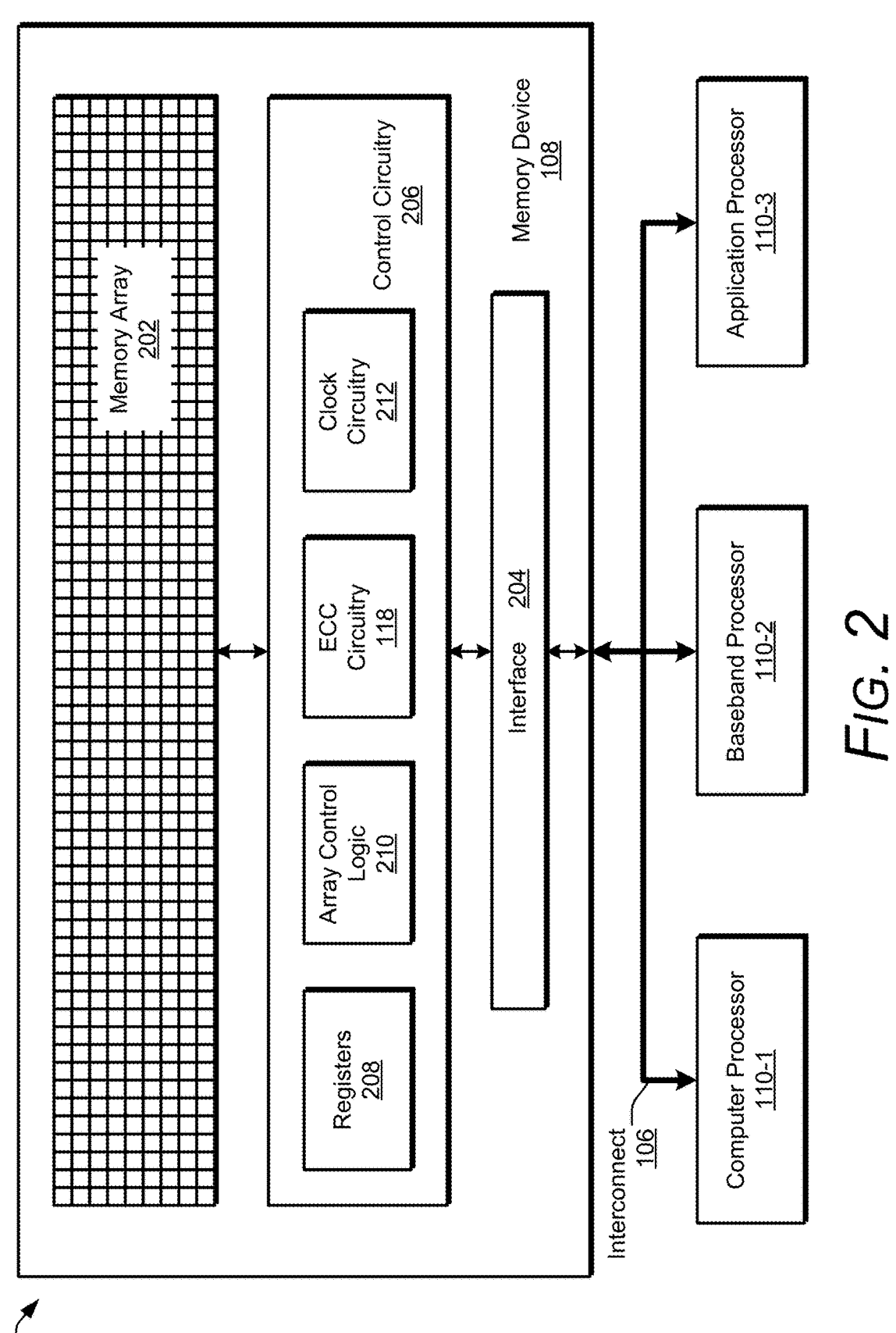
FIG. 2 illustrates an example computing system that includes a memory device in which aspects of system ECC circuitry routing can be implemented.

As illustrated in FIG. 1, the memory device 108 can include error correction code (ECC) circuitry 118, which may include an ECC engine (not shown in FIG. 1). The ECC circuitry 118, or the ECC engine thereof, can be realized as hardware (e.g., logic) that implements an ECC algorithm or other mechanism for detection and/or correction of bit errors. In some implementations, the ECC circuitry 118 can be shared among multiple dies 116 of the memory device 108. In aspects, the ECC circuitry 118 can perform single-bit or multibit ECC determinations, such as 2-bit or 3-bit ECC determinations. The hardware or logic of the ECC circuitry 118 may implement, for example, DEC Bose-Chaudhuri-Hocquenghem (BCH) code, a DEC TED BCH code, a Hamming code, and so forth. Other ECC algorithms and mechanisms are described below:

FIG. 2 illustrates an example computing system 200 that includes a memory device in which aspects of system ECC circuitry routing can be implemented. In some implementations, the computing system 200 includes at least one processor 110, at least one memory device 108, and at least one interconnect 106 configured to couple the processor 110 with the memory device 108. The memory device 108 can include, or be associated with, at least one memory array 202, at least one interface 204, and control circuitry 206 that is communicatively coupled to the memory array 202. In aspects, the memory device 108 may be configured as a CXL memory device or a memory module coupled to a link controller 112 of the computing system 200. The memory device 108 can correspond to one or more of the dies 116, a main memory, or a storage memory of the apparatus 102 of FIG. 1. Thus, the memory array 202 can include an array of memory cells, including but not limited to memory cells of DRAM, SDRAM, three-dimensional (3D) stacked DRAM, DDR memory, LPDDR SDRAM, and so forth. The memory array 202 and the control circuitry 206 may be components of a single semiconductor die or on separate semiconductor dies. The memory array 202 or control circuitry 206 may also be distributed across multiple dies or memory devices, which may be coupled via the interface 204.

The control circuitry 206 can include any of a number of components that can be used by the memory device 108 to perform various operations. These operations can include communicating with other devices, managing performance, and performing memory read or write operations. For example, the control circuitry 206 can include one or more registers 208, at least one instance of an array control logic 210, a clock circuitry 212, and the ECC circuitry 118. The registers 208 may be implemented, for example, as one or more registers that can store information to be used by the control circuitry 206 or another part of the memory device 108. The array control logic 210 may be implemented as circuitry that can provide command decoding, address decoding, input/output (I/O) functions, amplification circuitry, power supply management, power control modes, and other functions. The clock circuitry 212 may be implemented as circuitry that can provide synchronization of various components of the memory device 108 with one or more external clock signals that may be provided over the interconnect 106, such as a C/A clock (e.g., CK_t or CK_c) or data clock (e.g., WCK_t or WCK_c), and/or with at least one clock signal that is generated internally.

The interface 204 can couple the control circuitry 206 or the memory array 202 directly or indirectly to the interconnect 106. As shown in FIG. 2, the registers 208, the array control logic 210, the ECC circuitry 118, and the clock circuitry 212 can be part of a single component (e.g., the control circuitry 206). In other implementations, one or more of the registers 208, the array control logic 210, the ECC circuitry 118, or the clock circuitry 212 may be implemented as separate components, which can be provided on a single semiconductor die or disposed across multiple semiconductor dies. These components of the control circuitry 206 may be individually or jointly coupled to the interconnect 106 via the interface 204.

The interconnect 106 may be implemented with any one or more of a variety of interconnects that communicatively couple together various components and enable commands, addresses, and/or other information and data to be transferred between two or more of the various components (e.g., between the memory device 108 and the one or more processors 110). Although the interconnect 106 is represented with a single arrow in FIG. 2, the interconnect 106 may include at least one bus, at least one switching fabric, at least one crossbar, one or more wires or traces that carry voltage or current signals, at least one switch, one or more buffers, and so forth. Further, the interconnect 106 may include or be separated into at least the C/A bus 120 and the DQ bus 122 (as depicted in FIG. 1).

In some aspects, the memory device 108 may be realized as a "separate" physical component relative to the host device 104 (of FIG. 1) or any of the processors 110. Examples of physical components that may be separate include but are not limited to a PCB, which can be rigid or flexible: a memory card: a memory stick: and a memory module, including a SIMM or a DIMM. Thus, separate physical components may be located together within a single housing of an electronic device or may be distributed over a server rack, a data center, and so forth. Alternatively, the memory device 108 may be packaged or integrated with other physical components, including the host device 104 or the processor 110, such as by being combined on a common PCB or together in a single device package or by being integrated into an SoC.

The apparatuses and methods described herein may be appropriate for memory that is designed for lower-power operations or targeted for energy-efficient applications. Thus, the described principles may be incorporated into a low-power memory device. An example of a memory standard that relates to low-power applications is the LPDDR standard for SDRAM as promulgated by the Joint Electron Device Engineering Council (JEDEC) Solid State Technology Association. For clarity, some terminology in this document may draw from one or more of these standards or versions thereof, such as the LPDDR5 standard. The described principles, however, are also applicable to memories that comport with other standards, including other LPDDR standards (e.g., earlier versions or future versions such as LPDDR6) and DDR or GDDR standards, and to memories that do not adhere to a public standard.

As shown in FIG. 2, the one or more processors 110 may include a computer processor 110-1, a baseband processor 110-2, and an application processor 110-3, which are coupled to the memory device 108 through the interconnect 106. The processors 110 may each be, or may form a part of, a CPU, a GPU, an SoC, an ASIC, an FPGA, or the like. In some cases, a single processor can comprise multiple processing resources, each dedicated to different functions, such as modem management, applications, graphics, central processing, or the like. In some implementations, the baseband processor 110-2 may include or be coupled to a modem (not shown in FIG. 2) and may be referred to as a modem processor. The modem and/or the baseband processor 110-2 may be coupled wirelessly to a network via, for example, cellular, Wi-FiR, Bluetooth®, near field communication (NFC), or another technology or protocol for wireless communication.

In some implementations, the processors 110 may be connected directly to the memory device 108 via the interconnect 106 as shown in FIG. 2. In other implementations, one or more of the processors 110 may be indirectly connected to the memory device 108 (e.g., over a network connection, through one or more other devices, via PCIe). Further, each processor 110 may be realized similarly to the processor 110 of FIG. 1. Accordingly, one of the processors 110 can include or be associated with a respective link controller, such as the link controller 112 depicted in FIG. 1. Alternatively, two or more of the processors 110 may access the memory device 108 using the shared or system link controller 112.

Generally, the ECC circuitry 118 can provide ECC functionality for data stored in or read from the memory array 202 in accordance with various aspects described herein. The ECC circuitry 118 can, for instance, determine an ECC value for storage as part of a write operation or for comparison with a stored ECC value as part of a read operation. Example operations for the ECC circuitry 118 are described below with reference to FIGS. 8-10 and example configurations and/or architectures for system ECC circuitry routing are described with reference to FIGS. 3-7.

Example Techniques and Hardware

Figure 3:
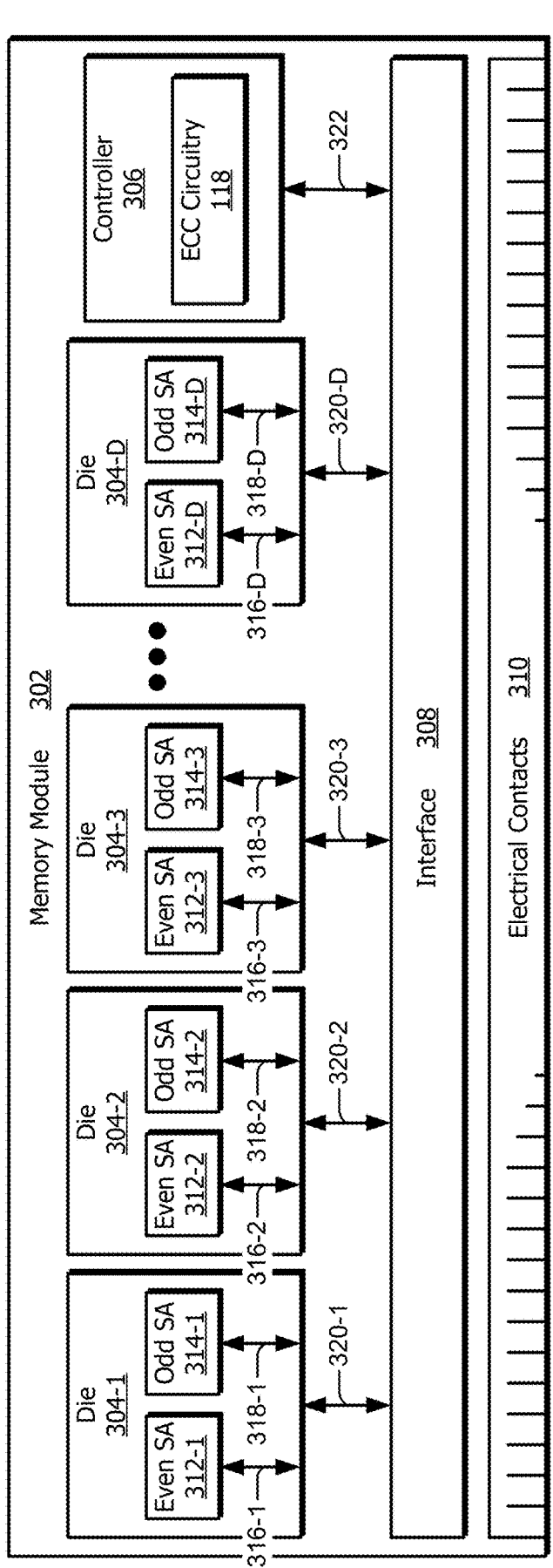
FIG. 3 illustrates an example memory device with ECC circuitry routed in accordance with one or more aspects.

FIG. 3 illustrates at 300 an example memory device with ECC circuitry routed in accordance with one or more aspects. An example memory module 302 includes multiple memory banks comprising multiple memory dies 304, which may be configured similar to or different from memory dies 116 as described with reference to FIG. 1. As depicted, the memory module 302 includes a first die 304-1, a second die 304-2, a third die 304-3, . . . , and a D$^{th}$ die 304-D, with "D" representing a positive integer. The memory module 302 can be realized, for example, as a CXL memory module, a SIMM, a DIMM, or a small outline DIMM (SO-DIMM). The dies 304 can be realized as DDR dies, including generational iterations (e.g., DDR2, DDR3, DDR4, DDR5); GDDR dies: HBM dies: LPDDR dies: DRAM dies: SDRAM dies: and so forth. The memory device 108 can correspond, for example, to a single die 304, multiple dies 304-1 . . . 304-D, a memory module 302 with at least one die 304, and so forth. The dies 304-1 . . . 304-D include even SAs 312 and odd SAs 314, which are coupled to the memory cell array of the memory die 304. In aspects, the even SAs 312 and odd SAs 314 may be used to read data as even and odd SA line data sets, respectively, from the memory cell array of the memory dies 304. As depicted, the dies 304-1 . . . 304-D include a first even SA 312-1, a second even SA 312-2, a third even SA 312-3, . . . , and a D$^{th}$ even SA 312-D, with "D" representing a positive integer. Also as depicted, the dies 304-1 . . . 304-D include a first odd SA 314-1, a second odd SA 314-2, a third odd SA 314-3, . . . , and a D$^{th}$ odd SA 314-D, with "D" representing a positive integer. Although two SAs (e.g., the even SA 312 and odd SA 314) are illustrated for every die 304, the die 304 may include more than two SAs (e.g., thousand, ten thousand).

As illustrated, each die 304 includes an even SA line 316 and an odd SA line 318, which are coupled to the respective even SA 312 and odd SA 314, respectively, of the die 304. As shown, the dies 304-1 . . . 304-D include a first even SA line 316-1, a second even SA line 316-2, a third even SA line 316-3, . . . , and a D$^{th}$ even SA line 316-D, with "D" representing a positive integer. Also as shown, the dies 304-1 . . . 304-D include a first odd SA line 318-1, a second odd SA line 318-2, a third odd SA line 318-3, . . . , and a D$^{th}$ odd SA line 3-18-D, with "D" representing a positive integer. Further illustrated by FIG. 3 are DQ lines 320. The dies 304-1 . . . 304-D include a first DQ line 320-1, a second DQ line 320-2, a third DQ line 320-3, . . . , and a D$^{th}$ DQ line, with "D" representing a positive integer. Together, the even and odd SA lines 316 and 318 operably couple the even and odd SAs 312 and 314, respectively, of the dies 304 to the DQ lines 320. The even and odd SA lines 316 and 318 and the DQ lines 320 may be implemented as unidirectional or bidirectional buses, for instance.

As further illustrated, the memory module 302 includes a controller 306, an interface 308, and one or more electrical contacts 310 (e.g., pins) to interface the memory module 302 to other components. The controller 306 includes ECC circuitry 118 and, although not shown, can include various other control circuitry components such as registers (e.g., the registers 208), control logic (e.g., the array control logic 210), clock circuitry (e.g., the clock circuitry 212), and the like. In aspects, respective DQ lines 320 operably couple the dies 304 to the interface 308 of the memory module 302. The controller 306 may be operably coupled to the interface 308 via a local interconnect 322. In some cases, the local interconnect 322 is realized as a unidirectional or bidirectional bus. Together, the even SA lines 316 and odd SA lines 318, the DQ lines 320, the interface 308, and the local interconnect 322 may operably couple the ECC circuitry 118 to the even SAs 312 and odd SAs 314 of the dies 304.

The memory module 302 can be configured or implemented in various manners. For example, the memory module 302 may include a PCB, and the multiple dies 304-1 . . . 304-D may be included in a package and mounted or otherwise disposed on the PCB. Alternatively, the memory module may include a die carrier, one or more electrical redistribution layers (RDLs), and/or a substrate on which the dies 304 are embodied to form a package. The package can be a single-die (e.g., includes one die) or multi-die (e.g., includes at least two dies) package. The dies 304 (e.g., memory dies) may be arranged in a line or along two or more dimensions as in a grid or array. In some cases, two or more of the dies 304 may be stacked, with intermediate dies configured to enable signal pass-through or coupling to a substrate, the controller, or another die. The dies 304 may be configured with a common size or different sizes, which may depend on a design capacity or architecture of the memory module. Each die 304 may be like one or more other dies 304 or may be unique on the given memory module 302 in terms of size, shape, data capacity, control circuitries, and so forth. Alternatively. or additionally, the dies 304 may also be distributed on multiple sides of the memory module 302.

Figure 4A:
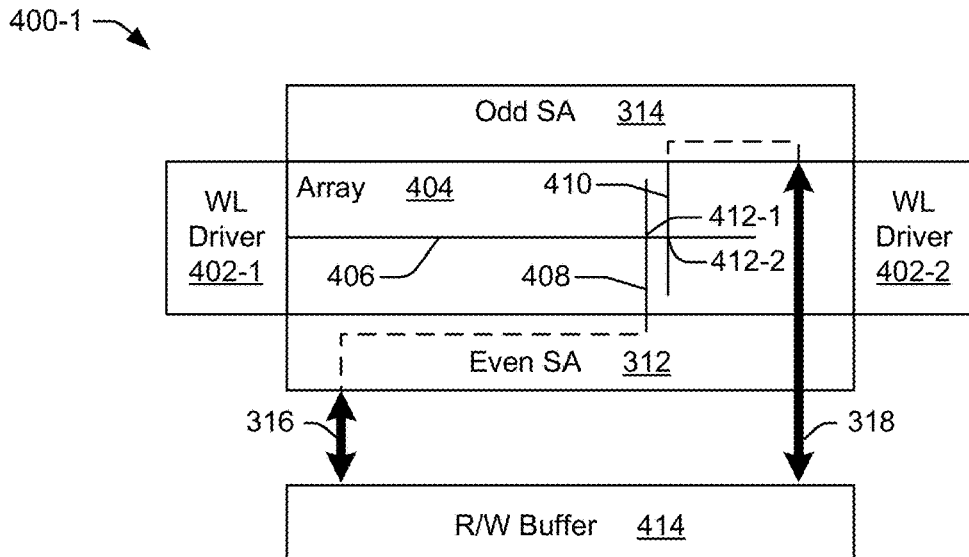
FIG. 4A illustrates an example configuration of memory cells coupled with sense amp (SA) lines in accordance with one or more aspects.

FIG. 4A illustrates, at 400-1 generally, an example configuration of memory cells coupled with SA lines in accordance with one or more aspects. As illustrated in a top-down view; an array of memory cells 412 (array 404, e.g., memory array 202) is bounded by an odd SA 314 at the top, an even SA 312 at the bottom, and word line (WL) drivers 402 at the left and right. The WL drivers include a first WL driver 402-1 to the left of the array 404 and a second WL driver 402-2 to the right of the array 404. Although the WL driver 402-1 may drive more than one (e.g., hundreds, thousands) WL, one WL 406 is shown for the sake of clarity. Additionally, although the even and odd SAs 312 and 314 may sense more than a single bit line (BL), only two BLs are shown. In this example, the BLs include an even BL 408 and an odd BL 410. At the intersection of the WL 406 and the even BL 408 is a first memory cell 412-1. At the intersection of the WL 406 and the odd BL 410 is a second memory cell 412-2. The array 404 may include more than two (e.g., thousands, millions) memory cells 412, although only two memory cells 412 are illustrated in FIG. 4A for clarity. In aspects, each of the memory cells 412 may store a bit (e.g., logical one or zero, high or low voltage) as an electrical level or amount of electrical charge within the memory cell. The bit can be a data bit or a parity bit for utilization by an ECC engine, for example. Furthermore, especially as process capabilities improve and minimum feature sizes decrease, it is not uncommon for the adjacent memory cells 412 to short (e.g., physically, electrically) together. For example, the memory cell 412-1 and memory cell 412-2 can short together, resulting in a double bit failure. FIG. 4A also illustrates an even SA line 316 and an odd SA line 318, which couple the even and odd SAs 312 and 314, respectively, to a R/W buffer 414. In this implementation, FIG. 4A illustrates that the first memory cell 412-1 is coupled to the even BL 408. The even BL 408 is coupled to the even SA 312, which in turn is coupled to the even SA line 316, as indicated by a dashed line. Likewise, the second memory cell 412-2 is coupled to the odd BL 410. The odd BL 410) is coupled to the odd SA 314, which in turn is coupled to the odd SA line 318, as indicated by a dashed line.

Figure 4B:
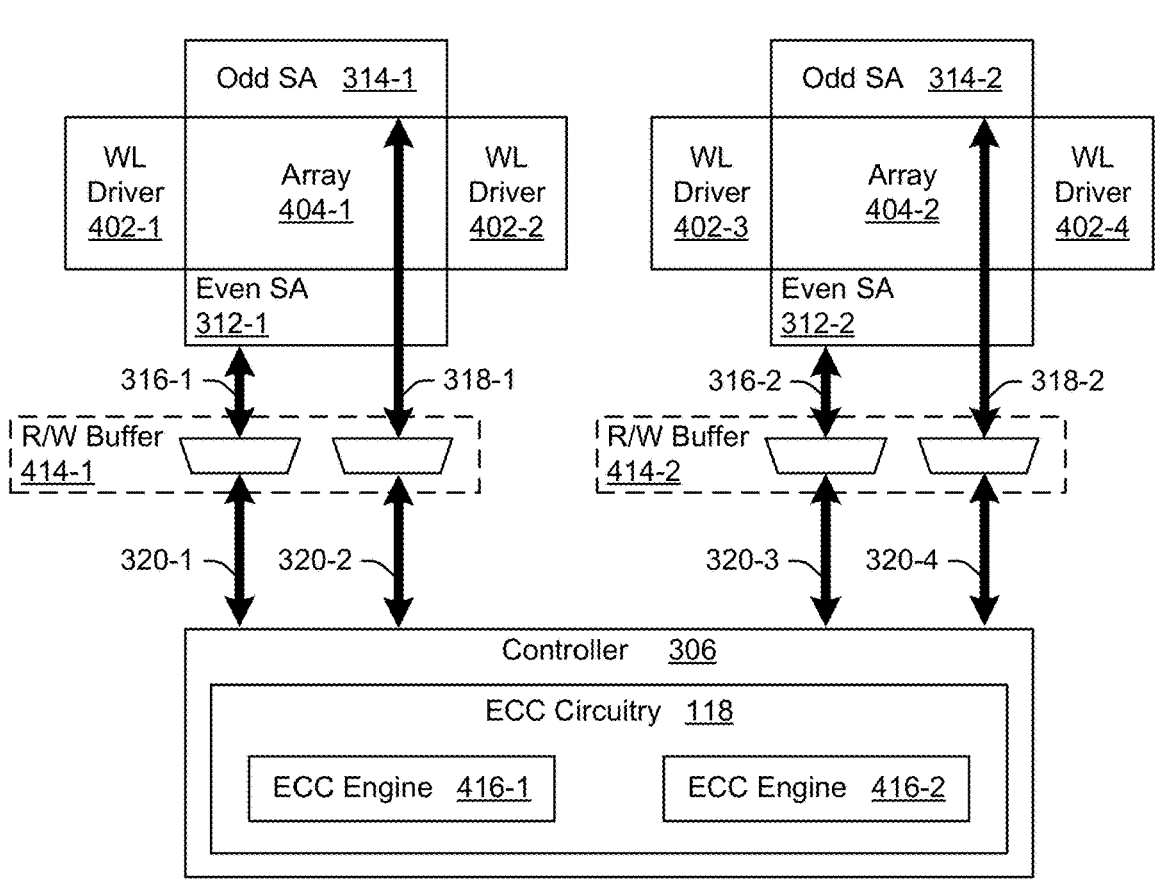
FIG. 4B illustrates an example configuration of SA lines coupled with a memory controller in accordance with one or more aspects.

FIG. 4B illustrates, at 400-2 generally, an example configuration of SA lines coupled with a memory controller in accordance with one or more aspects. As illustrated, a first array 404-1 is bounded by a first odd SA 314-1 at the top, a first even SA 312-1 at the bottom, a first WL driver 402-1 at the left, and a second WL driver 402-2 at the right. A second array 404-2 is bounded by a second odd SA 314-2 at the top, a second even SA 312-2 at the bottom, a third WL driver 402-3 at the left, and a fourth WL driver 402-4 at the right. The arrays 404 may be part of multiple memory banks, bank groups, dies, modules, and so forth. The arrays 404 may also be sub-arrays (e.g., portions of a larger array) in a single memory die.

FIG. 4B also illustrates a first R/W buffer 414-1, a second R/W buffer 414-2, and a controller 306. In aspects, the first R/W buffer 414-1 is operably coupled to the first array 404-1 via a first even SA line 316-1, the even SA 312-1, a first odd SA line 318-1, and the odd SA 314-1. The second R/W buffer 414-2 may also be operably coupled to the second array 404-2 via a second even SA line 316-2, the even SA 312-2, a second odd SA line 318-2, and the odd SA 314-2. Although not shown for the sake of clarity, the arrays 404 may include one or more WLs, one or more BLs. and multiple (e.g., thousands, millions) memory cells (e.g., memory cells 412) at each intersection of a WL and a BL. Furthermore, all memory cells at odd BL intersections ("odd bits") are operably coupled to odd SAs 314 and all memory cells at even BL intersections ("even bits") are operably coupled to even SAs 312. In this way, odd bits are serviced by odd SAs 314 and odd SA lines 318 while even bits are serviced by even SAs 312 and even SA lines 316.

FIG. 4B also illustrates a routing of DQ lines 320 in detail. In this example, the DQ lines 320 include a first DQ line 320-1, a second DQ line 320-2, a third DQ line 320-3, and a fourth DQ line 320-4. The DQ lines 320 operably couple the R/W buffers 414 to the controller 306. The controller 306 includes ECC circuitry 118, which includes a first ECC engine 416-1 and a second ECC engine 416-2. In implementations, the DQ lines 320 are grouped into upper DQ lines and lower DQ lines. As an example, a lower eight DQ lines 320 include DQ lines 320-1 and 320-3. In this implementation, the DQ lines 320-1 and 320-3 are operably coupled to the even SA lines 316-1 and 316-2, respectively, via the R/W buffers 414. Additionally, an upper eight DQ lines 320 include DQ lines 320-2 and 320-4, which are operably coupled to the odd SA lines 318-1 and 318-2, respectively, via the R/W buffers 414. Although two groups of eight DQ lines 320 are described, the quantity of the grouped DQ lines 320 is not limited to eight but rather can include two, four, eight, or 16, for example. Furthermore, the DQ lines 320 may also be grouped by even and odd DQ lines 320, rather than by lower and upper halves.

Figure 5:
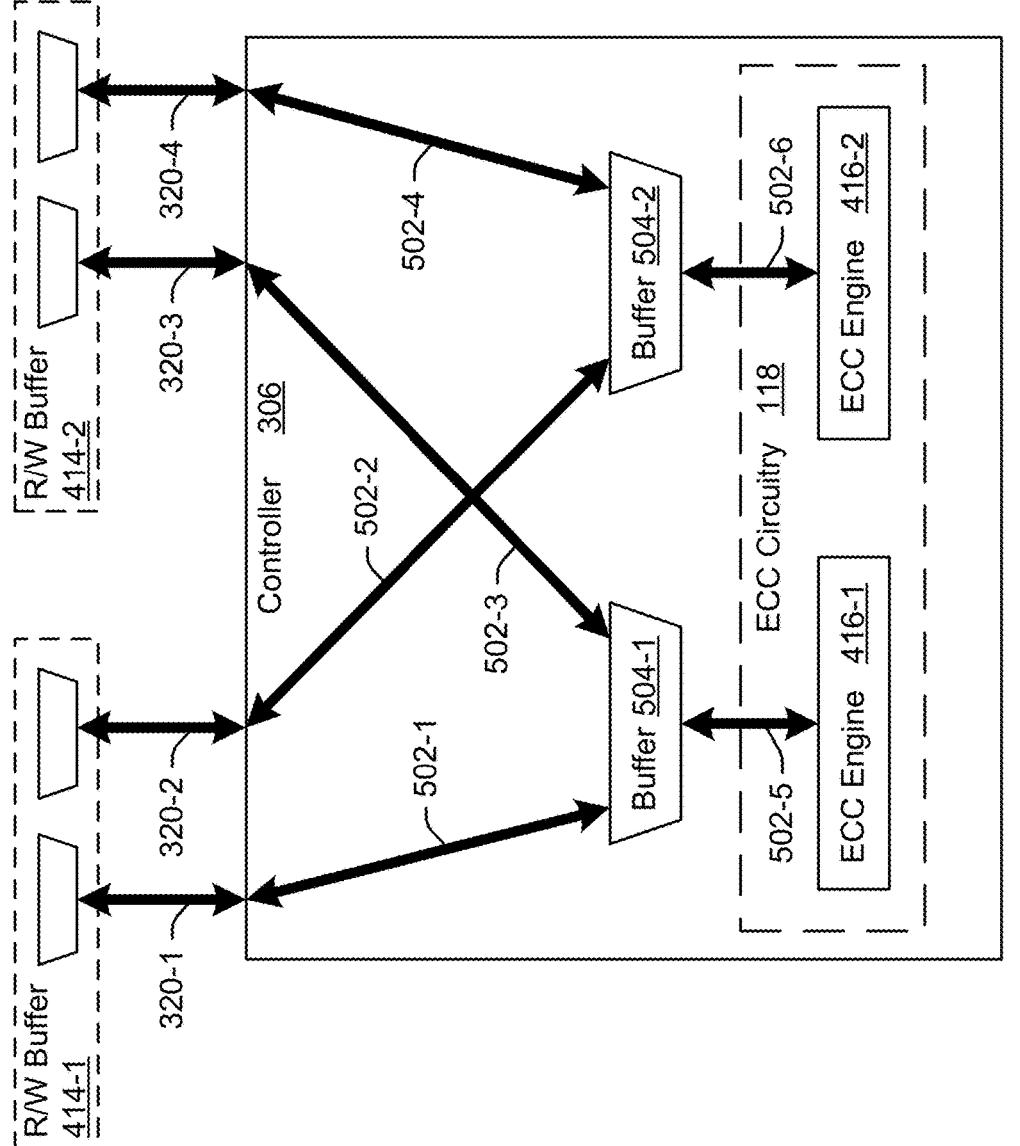
FIG. 5 illustrates an example of system ECC circuitry routing implemented in a memory controller in accordance with one or more aspects.

FIG. 5 illustrates at 500 an example of system ECC circuitry routing implemented in a memory controller in accordance with one or more aspects. As illustrated. FIG. 5 includes a first R/W buffer 414-1, a second R/W buffer 414-2, and a controller 306. FIG. 5 also illustrates DQ lines 320, including a first DQ line 320-1, a second DQ line 320-2, a third DQ line 320-3, and a fourth DQ line 320-4. As described with reference to FIG. 4B, the DQ lines 320-1 and 320-3 may be grouped as lower DQ lines 320 coupled with even SA lines (e.g., even SA lines 316), while the DQ lines 320-2 and 320-4 may be grouped as upper DQ lines 320 coupled with odd SA lines (e.g., odd SA lines 318). Said differently, the DQ lines 320-1 and 320-3 carry even SA line data (e.g., bits from even BLs) and the DQ lines 320-2 and 320-4 carry odd SA line data (e.g., bits from odd BLs) in accordance with aspects of system ECC circuitry routing.

In implementations, the controller 306 includes system ECC circuitry routing realized as interconnects 502 (e.g., bus routings, trace routings, signal paths). A first interconnect 502-1 is coupled to the first DQ line 320-1, a second interconnect 502-2 is coupled to the second DQ line 320-2, a third interconnect 502-3 is coupled to the third DQ line 320-3, and a fourth interconnect 502-4 is coupled to the fourth DQ line 320-4. In this way, the interconnects 502-1 and 502-3 carry even SA line data to the controller 306 and the interconnects 502-2 and 502-4 carry odd SA line data to the controller 306. Within the controller 306, the interconnects 502-1 . . . 502-4 are coupled to buffers 504 of the controller 306. In this example, a first buffer 504-1 is coupled to the interconnects 502-1 and 502-3, which are the even SA line data interconnects 502. A second buffer 504-2 is coupled to the interconnects 502-2 and 502-4, which are the odd SA line data interconnects 502. As shown in FIG. 5, additional interconnects 502-5 and 502-6 couple the buffers 504 to respective ECC engines 416 included in ECC circuitry 118. Here the interconnect 502-5 couples the buffer 504-1 to a first ECC engine 416-1, while the interconnect 502-6 couples the buffer 504-2 to a second ECC engine 416-2. The ECC circuitry 118 can provide ECC functionality to multiple memory arrays (e.g., arrays 404). The multiple memory arrays can include multiple sub-arrays, arrays, memory banks, bank groups, dies (e.g., dies 304), or modules, for example.

The ECC functionality can include providing an ECC determination. To provide the ECC determination, the ECC engines 416 determine at least one ECC value based on data. The ECC engines 416 can use any ECC algorithm or combination of multiple ECC algorithms to compute the ECC value. Examples of ECC algorithms include those relating to block codes, such as Hamming codes, Reed-Solomon codes, Golay codes, BCH codes, multidimensional codes, other ECC coding schemes described herein, and the like. Generally, an ECC engine 416 can employ one or more alternative ECC algorithms for block codes or employ an alternative coding scheme.

In aspects, the ECC engine 416 can employ ECC algorithms of varying strengths or capabilities. These strengths or capabilities may at least partially be indicated by, or correspond to, a bit length of the ECC processing. Example bit lengths of ECC processing include one-bit and multibit ECC processing. Multibit ECC processing can be two-bit (2-bit), three-bit (3-bit), four-bit (4-bit), and so forth. By way of example, one-bit ECC processing may enable detection of one error bit but no or limited error correction. In contrast, two-bit ECC processing may enable detection of up to two error bits and correction of one error bit. Generally, more ECC bits can entail circuitry that consumes more area, uses more power, or performs ECC processes more slowly. For instance, transitioning from ECC1 (one-bit ECC) to ECC2 (two-bit ECC) can entail an area increase of three to four times (3-4×).

In example operations, the first ECC engine 416-1 accepts first data via the interconnect 502-5 and the second ECC engine 416-2 accepts second data via the interconnect 502-6. The ECC engines 416-1 and 416-2 each produce an ECC value based on the first and second data, respectively, using any suitable ECC algorithm. Here, the first data is an even SA data set because the first ECC engine 416-1 accepts it via the interconnect 502-5, which carries even SA data from the memory array via the DQ lines 320-1 and 320-3, as described herein. Further, the second data is an odd SA data set because the second ECC engine 416-2 accepts it via the interconnect 502-6, which carries odd SA data from the memory array via the DQ lines 320-2 and 320-4. The respective ECC values produced by the ECC engines 416 can be stored in association with the corresponding even or odd SA line data set. For example, the ECC values can be stored in, or at least at, a single memory array as the associated data sets. Additionally or alternatively, the ECC values can be stored in, or at least at, the ECC circuitry 118 in a table or other memory (not shown) that holds ECC values. The ECC circuitry 118 can include or have access to, for instance, an ECC-dedicated memory or a memory that stores memory protection information generally (e.g., ECC values, hash codes, encryption data).

At least a portion of the ECC circuitry 118 (e.g., including the ECC engines 416) can comprise or realize ECC logic. Thus, in some implementations, the ECC engines 416 of the ECC circuitry 118 can provide ECC determinations for two or more of the memory arrays 404, including multiple memory banks, bank groups, dies, modules, and so forth. The ECC circuitry 118 can provide other ECC functionality, such as interacting with the buffers 504 or another internal bus (not shown in FIG. 5) to receive data sets or ECC values from or transmit them to an external interconnect (e.g., DQ lines 320, interface 308) or one or more of the memory arrays 404. ECC functionality can further include determining if at least one error has occurred, correcting an error, signaling to other control circuitry that an error has occurred and/or has been corrected, and so forth.

Figure 6:
FIG. 6 illustrates an example configuration of ECC engines coupled with memory dies via system ECC circuitry routed in accordance with one or more aspects.

FIG. 6 illustrates, at 600 generally, an example configuration of ECC engines coupled with memory dies via system ECC circuitry routed in accordance with one or more aspects. In this example, each of the two memory dies include an interface die 602 and a link die 604. The memory dies may be any type of memory dies, including LPDDR5 SDRAM memory dies, and can be included in a memory module such as a CXL memory module, for example. The interface die 602 is represented as an interface die upper DQ (UDQ) block 602-1 and an interface die lower DQ (LDQ) block 602-2. The link die 604 is represented as a link die UDQ block 604-1 and a link die LDQ block 604-2. In implementations, the LDQs of the memory dies may be associated with even SA line data sets and the UDQs may be associated with odd SA line data sets (e.g., FIG. 4B). However, in other implementations, including the example illustrated in FIG. 6, the LDQs and UDQs of the memory dies may be associated with both even and odd SA line data sets. As an example, the memory dies may have 16 DQs grouped into a lower eight DQs and an upper eight DQs. The lower eight DQs may be coupled to even and odd SAs. Similarly, the upper eight DQs may be coupled to even and odd SAs. Said another way, even and odd SA line data can be transmitted on any one of the sixteen DQs. Regarding FIG. 6, the interface die UDQ and LDQ blocks 602-1 and 602-2, as well as the link die UDQ and LDQ blocks 604-1 and 604-2, can transmit both even and odd SA line data sets.

As shown in FIG. 6, the interface die 602 and the link die 604 configuration are operably coupled with an instance of the ECC circuitry 118 in accordance with one or more aspects. In this example, the ECC circuitry 118 includes a first ECC engine 416-1 and a second ECC engine 416-2, which may be configured as single-bit ECC engines or multi-bit ECC engines. Generally, the ECC engines 416 may be configured to provide ECC determinations for read operations, write operations, or both. In implementations, the ECC engines 416 include encoders 610 and decoders 612. The first ECC engine 416-1 can include a first encoder 610-1 and a first decoder 612-1, and the second ECC engine 416-2 can include a second encoder 610-2 and a second decoder 612-2. The encoders 610 of the ECC engines 416 may be configured to provide ECC determinations for write operations, and the decoders 612 of the ECC engines 416 may be configured to provide ECC determinations for read operations, for example. Further, the ECC engines 416 can employ one or more ECC algorithms of varying strengths or capabilities. The strengths or capabilities may at partially be indicated by a bit length of the ECC processing. The bit length can be one bit or multibit, and generally more ECC bits can entail circuitry (e.g., ECC circuitry 118) that consumes more area. Depending on a system architecture and design requirements of an apparatus, a manufacturer can incorporate ECC circuitry directly on-die (e.g., on a memory die 304), on a controller (e.g., control 306), on a processor (e.g., computer processor 110), or as standalone circuitry coupled to any of these entities or an interconnect between them.

In FIG. 6, the system ECC circuitry routing is realized as data buses (or data paths). Data buses 606 may be configured as unidirectional or bidirectional buses, for example. The data buses 606 may be any one of a variety of bus widths, including but not limited to 32 bits, 64 bits, 128 bits, 256 bits, and so on. The data buses 606 may be configured to transmit bits between the ECC circuitry 118 and the memory dies. The transmitted bits may include data bits and parity bits. The parity bits may be used by the ECC engines 416 to detect or correct bit errors or provide ECC determinations generally. The data buses 606 are configured as even data buses 606-1 and odd data buses 606-2. In this way, even SA line data sets are transmitted via the even data buses 606-1 and odd SA line data sets are transmitted via the odd data buses 606-2.

Recall that it is not uncommon for a double bit error to occur in two adjacent memory cells (e.g., memory cells 412 of FIG. 4A), which may include when two adjacent cells short together, especially as minimum feature sizes (e.g., cell pitch, WL pitch, BL pitch) continue to shrink. Also recall that adjacent memory cells are coupled to different SAs (e.g., via separate sense lines or circuits). That is, a first memory cell (e.g., memory cell 412-1 of FIG. 4A) on an even BL is coupled to an even SA (e.g., even SA 312 of FIG. 3), and a second memory cell (e.g., memory cell 412-2 of FIG. 4A) on an odd BL is coupled to an odd SA (e.g., odd SA 314 of FIG. 3). In aspects of system ECC routing, when a double bit error occurs, one of the failing bits is transmitted as part of an even SA line data set via the even data buses 606-1 and the other of the failing bits is transmitted as part of an odd SA line data set via the odd data buses 606-2. In this way, aspects of system ECC routing may enable the ECC engines 416 to correct the double bit error, even if each ECC engine 416 is configured to utilize one-bit ECC processing. Thus, system ECC routing as described herein may enable the detection and correction of double bit errors with one-bit ECC processing, which can shrink an area and reduce power consumption of ECC circuitry of a memory die or memory module. Additionally, or alternatively, the ECC engines 416 may be configured to utilize multibit ECC processing to provide greater protection for potential additional bit errors.

As shown in FIG. 6, the first ECC engine 416-1 can be coupled to the even data buses 606-1 and the second ECC engine 416-2 can be coupled to the odd data buses 606-2. In this implementation, the first ECC engine 416-1 provides ECC determinations (e.g., detections and corrections) for even SA line data sets and the second ECC engine 416-2 provides ECC determinations for odd SA line data sets. Further, double bit errors on a same WL, such as those resulting from an electrical short between adjacent memory cells, can be corrected using one-bit ECC engines. In other implementations where, for example, data reliability is paramount (e.g., automotive assistance systems), a multibit ECC engine may be used in conjunction with the system ECC circuitry routing realized as the even and odd data buses 606-1 and 606-2.

Figure 7:
FIG. 7 illustrates an example configuration of ECC engines coupled with a memory die via system ECC circuitry routed in accordance with one or more aspects.

FIG. 7 illustrates at 700 an example configuration of ECC engines coupled with a memory die via system ECC circuitry routed in accordance with one or more aspects. In this example, a memory die 702 is operably coupled with ECC circuitry 118, which may be configured as described with reference to FIG. 6. The memory die 702 may include any type of memory die, including LPDDR5 SDRAM, and may be included in a CXL memory module, for example. As shown in FIG. 7, the memory die 702 is represented as a UDQ block 702-1 and an LDQ block 702-2. In this example, the UDQs and LDQs of the memory die 702 are coupled to both even SA line data sets and odd SA line data sets. Accordingly, as in FIG. 6, the system ECC circuitry routing is realized as even data buses 606-1 (for even SA lines) and odd data buses 606-2 (for odd SA lines). The even data buses 606-1 are coupled to UDQs and LDQs that are coupled to even SAs, so that the even data buses 606-1 transmit even SA line data sets. The odd data buses 606-2 are coupled to UDQs and LDQs that are coupled to odd SAs, so that the odd data buses 606-2 transmit odd SA line data sets.

In this example, an instance of the ECC circuitry 118 includes a first ECC engine 416-1 and a second ECC engine 416-2, each of which may include respective encoders 610 and decoders 612. The first ECC engine 416-1 includes a first encoder 610-1 and a first decoder 612-1. The second ECC engine 416-2 includes a second encoder 610-2 and a second decoder 612-2. The encoders 610, for example, may be configured to provide ECC determinations for write operations, while the decoders 612 may be configured to provide ECC determinations for read operations. Further, the even data buses 606-1 are coupled to the first ECC engine 416-1, while the odd data buses 606-2 are coupled to the second ECC engine 416-2. If a double bit error occurs, for example, a first failing bit is coupled to an even SA and a second failing bit is coupled to an odd SA. Accordingly, the even SA line data set transmitted via the even data buses 606-1 to the first ECC engine 416-1 includes a first one-bit error. Also, the odd SA line data set transmitted via the odd data buses 606-2 to the second ECC engine 416-2 includes a second one-bit error. In this implementation, double bit errors on the same WL (as described above) may be corrected by even a one-bit ECC engine because the two failing bits of the double bit error are separated onto the separate data buses 606 and transmitted to the separate ECC engines 416.

Example Methods

This section describes example methods 800 through 1000 with reference to FIGS. 8 to 10 for implementing memory access operations in accordance with various aspects of system ECC circuitry routing. These descriptions may also refer to components, entities, and other aspects depicted in FIGS. 1 to 7, to which reference is made only by way of example.

FIG. 8 illustrates an example method 800 for error correction with system ECC circuitry routing. In aspects, operations of the method 800 are implemented by or with the ECC circuitry 118 as described with reference to FIGS. 1 to 7.

At block 802, an apparatus receives respective data sets for a pair of SA lines that comprise even and odd SA line data sets. For example, a controller 306 receives the data sets as even and odd SA line data sets from a memory (e.g., the memory module 302 or the one or more dies 304 combined into a chip carrier). Here, the memory die 304 of the one or more memory dies 304-1 to 304-D (where "D" is one or greater) includes multiple memory banks (e.g., memory array 202). The even and odd SA lines 316 and 318 may operably couple the even and odd SAs 312 and 314, respectively, to the DQ lines 320 or R/W buffers 414, which operably couple the dies 304 to the interface 308. The interface 308 may be operably coupled to the controller 306. The DQ lines 320 may be configured to maintain a distinction between the even SA line data set and the odd SA line data set. The interface 308 may also be configured to maintain a same distinction between the even and odd SA data sets. In this way, the controller 306 can read data from a memory as even and odd SA line data sets.

At blocks 804 and 806, the apparatus provides the even SA line data set to a first ECC engine and the odd SA line data set to a second ECC engine, respectively. For example, the controller 306 provides the even SA line data set to the first ECC engine 416-1 via the even data buses 606-1. The controller 306 can provide the odd SA line data set to the second ECC engine 416-2 via the odd data buses 606-2. In some cases, the controller 306 reads the even and odd SA line data sets from a memory die (e.g., an LPDDR5 SDRAM die) via distinct read paths. For example, the controller 306 reads the even SA line data set via a first read path disposed on the memory die and reads the odd SA line data set via a second read path disposed on the die. After reading the data sets, the controller 306 can provide the even SA line data set to the first ECC engine 416-1 and the odd SA line data set to the second ECC engine 416-2.

At blocks 808 and 810, the apparatus receives a first ECC determination and a second ECC determination from the first and second ECC engines, respectively. The first and second ECC determinations may be based on the even and odd SA line data sets, respectively. As an example, the first ECC engine 416-1 determines that specific bit positions (e.g., first bit position, second bit position, fourth bit position) in the even SA line data set include parity bits for the first ECC value and the second ECC engine 416-2 determines that specific bit positions in the odd SA line data set include parity bits for the second ECC value. Depending on an error correction code (e.g., BCH code. Hamming code) implemented by the ECC engines 416, the ECC engines 416 may determine that a single-bit or multi-bit error exists in the even or odd SA line data sets. For example, the first ECC engine 416-1 may implement Hamming code to determine that a single-bit error exists in the even SA line data set.

At blocks 812 or 814, the apparatus corrects, by the first ECC engine or the second ECC engine, a single-bit error in the even SA line data set or the odd SA line data set based on the first or second ECC determinations, respectively. For example, the first ECC engine 416-1 corrects a single-bit error based on the first ECC determination or the second ECC engine 416-2 corrects a single-bit error based on the second ECC determination. In some cases, the first ECC engine and the second ECC engine 416 each correct respective single-bit errors existing in both odd and even SA line data sets. As an example, the single-bit error existing in the even SA line data set may be a first bit of a double-bit error and the single-bit error existing in the odd SA line data set may be a second bit of the double-bit error (as described with reference to FIGS. 4A and 4B). Thus, the ECC engines 416 (e.g., single-bit ECC engines) may correct both single-bit errors existing in the SA line data sets to provide correction for a double-bit error.

FIG. 9 illustrates an example method 900 for writing data of even SA lines and odd SA lines to a memory array. In aspects, operations of the method 900 are implemented by or with the ECC circuitry 118, the interconnect 106, the control circuitry 206, the interface 204, the controller 306, and/or the interface 308 as described with reference to FIGS. 1 to 7.

At block 902, an apparatus apportions data into an even SA line data set and an odd SA line data set. For example, a controller 306 may receive the data from a processor (e.g., computer processer 110-1, baseband processor 110-2, application processor 110-3), a storage device (e.g., an SSD) of the host device 104, or from a memory (e.g., the memory module 302 or the one or more dies 304 combined into a chip carrier). The controller 306 may then apportion the data into respective even SA line data and SA odd line data sets for writing to a memory array. At blocks 904 and 906, the apparatus provides the even SA line data set to a first ECC engine and the odd SA line data set to a second ECC engine. For example, the controller 306 provides the even SA line data set to the first ECC engine 416-1 via the even data buses 606-1 and provides the odd SA line data set to the second ECC engine 416-2 via the odd data buses 606-2.

At blocks 908 and 910, the apparatus receives a first ECC determination and a second ECC determination from the first and second ECC engines, respectively. As an example, the first ECC engine 416-1 provides the first ECC determination based on the even SA line data set and the second ECC engine 416-2 provides the second ECC determination based on the odd SA line data set. The first and second ECC determinations may include any suitable quantity of bits, including but not limited to eight bits, 16 bits, 32 bits, 64 bits, and so forth. For example, the first and second ECC determinations may be respective ECC encodings for the data included in the even and odd SA line data sets. In another example, the data included in the even and odd SA line data sets may include ECC encodings determined by a CPU, GPU, or other appropriate component. In such an example, the first and second ECC determinations may be copies of the ECC encodings as determined by the CPU, GPU or other component.

At blocks 912 and 914, the apparatus includes or incorporates the first ECC determination with the even SA line data set and the second ECC determination with the odd SA line data set. For example, the first and second ECC engines 416-1 and 416-2 provide the controller 306 with the first and second ECC determinations, respectively, which the controller 306 incorporates into the even and odd SA line data sets. Depending on a correction code (e.g., BCH code, Hamming code) implemented by the ECC engines 416, the ECC determinations may include a quantity of bits (e.g., eight bits, 16 bits, 32 bits) at specific bit positions in the even or odd SA line data sets. As an example, the first ECC engine 416-1 may implement Hamming code to provide three ECC bits at bit positions one, two, and four as the first ECC determination for four data bits at bit positions three, five, six, and seven included in the even SA line data set. In the present example, bit position one may be the least significant bit position and bit position seven may be the most significant bit position. Similarly, the second ECC engine 416-2 may implement Hamming code to provide three ECC bits for four data bits in the odd SA line data set.

At block 916, the apparatus writes the even SA line data set including the first ECC determination and the odd SA line data set including the second ECC determination to a memory array. For example, the controller 306 writes the even and odd SA line data sets including the first and second ECC determinations to one of the memory dies 304 via distinct write paths. The controller 306 may write the even SA line data set to the memory die via a first write data path disposed on the die. The controller 306 may also write the odd SA line data set to the memory die via a second write data path disposed on the die. The memory array can include one or more sub-arrays, memory banks, bank groups, memory dies, or modules (e.g., CXL memory modules).

FIG. 10 illustrates an example method 1000 for reading data of even SA lines and odd SA lines. In aspects, operations of the method 1000 are implemented by or with the ECC circuitry 118 as described with reference to FIGS. 1 to 7.

At 1002, an apparatus reads, from a memory array, respective data sets for a pair of SA lines that comprise an even SA line data set and an odd SA line data set. For example, the controller 306 reads the even and odd SA line data sets from a memory die (e.g., an LPDDR5 SDRAM die) or a storage device (e.g., an SSD, an HDD). The controller 306 may read the even SA line data set via a first read path disposed on the memory die. Further, the controller 306 may read the odd SA line data set via a second read path disposed on the die.

At 1004, the apparatus provides the even SA line data set to a first ECC engine and the odd SA line data set to a second ECC engine. For example, the controller 306 provides the even SA line data set to the first ECC engine 416-1 and the odd SA line data set to the second ECC engine 416-2. The controller 306 may then provide the data sets to the ECC engines 416 via an interconnect (e.g., local interconnect 322, interface 308, interface 204).

At 1006, the apparatus receives a first ECC determination from the first ECC engine and receives a second ECC determination from the second ECC engine. For example, the controller 306 receives the first ECC determination from the first ECC engine 416-1 and receives the second ECC determination from the second ECC engine 416-2. The first and second ECC determinations may include any quantity of bits (e.g., eight bits, 16 bits, 32 bits) inserted at specific bit positions in accordance with an ECC coding scheme (e.g., BCH code, Hamming code). The first and second ECC determinations may, for example, indicate that at least one bit error is present in the even SA line data set or the odd SA line data set. As another example, the first and second ECC determinations may indicate that no bit errors are present in the even or odd SA line data sets.

At 1008, the apparatus corrects a bit error in the odd and/or even data sets read from the memory array. For example, the first ECC engine 416-1 may correct at least one bit error in the even SA line data set based on the first ECC determination. Similarly, the second ECC engine 416-2 may correct at least one bit error in the odd SA line data set based on the second ECC determination. As another example, both the first ECC engine 416-1 and the second ECC engine 416-2 may each correct at least one bit error in the even SA line data set and the odd SA line data set, respectively. Depending on capabilities of the ECC engines 416, the at least one-bit error can include a single-bit error, a double-bit error, or a multibit error in which three- or more-bit errors exist. For example, the ECC engines 416, when implemented as ECC1 engines, may each correct a single-bit error in the SA line data sets. As a further example, the ECC engines 416, when implemented as ECC2 engines, may each correct a double-bit error in the SA line data sets.

At 1010, the apparatus verifies the odd and even data sets read from the memory array. For example, the first ECC engine 416-1 may verify that the data included in the even SA line data set does not include any bit errors. Similarly, the second ECC engine 416-2 may verify that the data included in the odd SA line data set does not include any bit errors. In some cases, the ECC engines 416 verify the data sets read from the memory array by interpreting parity bits included in the data sets. The parity bits may indicate that no bit errors exist in either the even SA line data set or the odd SA line data set. As an additional example, the first ECC engine 416-1 may correct at least one bit error in the even SA line data set (e.g., at 1008) and the second ECC engine 416-2 may verify that the odd SA line data set does not include any bit errors. Similarly, for example, the first ECC engine 416-1 may verify that the even SA line data set does not include any bit errors and the second ECC engine 416-2 may correct at least one bit error (e.g., at 1008) in the odd SA line data set.

At 1012, the apparatus provides the data sets read from the memory array to an interconnect. As an example, the controller 306 may provide the even SA line data set and the odd SA line data set to the interface 308 or the DQ lines 320. As another example, the ECC circuitry 118 may provide the even and odd SA line data sets to the buffers 504 or the data buses 606.

For the figures described above, the orders in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods may be implemented in, for example, hardware (e.g., fixed-logic circuitry or a processor in conjunction with a memory), firmware, software, or some combination thereof. The methods may be realized using one or more of the apparatuses or components shown in FIGS. 1 to 8, the components of which may be further divided, combined, rearranged, and so on. The devices and components of these figures generally represent hardware, such as electronic devices, packaged modules, IC chips, or circuits: firmware or the actions thereof: software: or a combination thereof. Thus, these figures illustrate some of the many possible systems or apparatuses capable of implementing the described methods.

Examples of multiple implementations are described below:

Example 1: An apparatus comprising: a memory array comprising multiple memory banks; an interface operably coupled with respective sense amplifier (SA) lines of the multiple memory banks: and a controller that is coupled to the interface, the controller comprising error correction code (ECC) circuitry configured to, for a set of data input/output (DQ) lines of one of the multiple memory banks: receive respective data sets for SA lines that comprise an even SA line data set and an odd SA line data set: provide the even SA line data set to a first ECC engine: provide the odd SA line data set to a second ECC engine: receive a first ECC determination from the first ECC engine: receive a second ECC determination from the second ECC engine: and correct a bit error in the even SA line data set based on the first ECC determination: or correct a bit error in the odd SA line data set based on the second ECC determination.

Example 2: The apparatus of example 1, wherein the ECC circuitry includes the first ECC engine and the second ECC engine.

Example 3: The apparatus of example 1, wherein the ECC circuitry of the controller is further configured to: correct the bit error in the even SA line data set based on the first ECC determination: and correct the bit error in the odd SA line data set based on the second ECC determination.

Example 4: The apparatus of example 3, wherein: the bit error in the even SA line data set is associated with a first SA line of the SA lines of the memory bank: and the bit error in the odd SA line data set is associated with a second SA line of the SA lines of the memory bank that is adjacent to the first SA line of the memory bank.

Example 5: The apparatus of example 1, wherein: the first ECC determination indicates that at least one bit error exists in the even SA line data set: and the second ECC determination indicates that at least one bit error exists in the odd SA line data set.

Example 6: The apparatus of example 1, wherein: the first ECC engine comprises a first single-bit ECC engine coupled to the even SA line data set: and the second ECC engine comprises a second single-bit ECC engine coupled to the odd SA line data set.

Example 7: The apparatus of example 1, wherein: the first ECC engine comprises a first multi-bit ECC engine coupled to the even SA line data set: and the second ECC engine comprises a second multi-bit ECC engine coupled to the odd SA line data set.

Example 8: The apparatus of example 1, wherein the set of DQ lines of the memory bank comprise 16 DQ signals and respective parity data signals of a first channel and a second channel of the memory bank.

Example 9: The apparatus of example 8, wherein the 16 DQ and the respective parity data signals of the first channel and the second channel of the memory bank comprise: a first eight DQ signals and a first parity data signal connected to a first interface die of the memory bank; and a second eight DQs and a second parity data signal connected to a second interface die of the memory bank.

Example 10: The apparatus of example 8, wherein the apparatus is configured as a Compute Express Link (CXL) memory module, a single in-line memory module (SIMM), a dual in-line memory module (DIMM), or a small outline DIMM (SO-DIMM).

Example 11: The apparatus of example 1, wherein the memory array is configured as one of a double data rate (DDR) memory array. DDR2 memory array, DDR3 memory array, DDR4 memory array, DDR5 memory array, synchronous dynamic random-access memory (SDRAM) array, low-power DDR (LPDDR) SDRAM array, LPDDR5 SDRAM array, graphics DDR (GDDR) SDRAM array, or high-bandwidth memory (HBM) array.

Example 12: A method comprising: receiving, via an interface coupled to sense amplifier (SA) lines of a memory bank, an even SA line data set for a set of data input/output (DQ) signal lines of the memory bank: receiving, via the interface coupled to the SA lines of a memory bank, an odd SA line data set for the set of DQ signal lines of the memory bank: providing the even SA line data set to a first error correction code (ECC) engine of a memory controller; providing the odd SA line data set to a second ECC engine of the memory controller: receiving a first ECC determination from the first ECC engine based on the even SA line data set; receiving a second ECC determination from the second ECC engine based on the odd SA line data set: and correcting a bit error in the even SA line data set based on the first ECC determination: or correcting a bit error in the odd SA line data set based on the second ECC determination.

Example 13: The method of example 12, further comprising: correcting the bit error in the even SA line data set based on the first ECC determination: and correcting the bit error in the odd SA line data set based on the second ECC determination.

Example 14: The method of example 13, wherein: the bit error in the even SA line data set is associated with a first SA line of the SA lines of the memory bank: and the bit error in the odd SA line data set is associated with a second SA line of the SA lines of the memory bank that is adjacent to the first SA line of the memory bank.

Example 15: The method of example 12, wherein: the even SA line data set and the odd SA line data set are received as an SA line data set that corresponds to the DQ signal lines, and the method further comprises: apportioning the SA line data set into the even SA line data set and the odd SA data line set prior to providing the even SA line data set to the first ECC engine and providing the odd SA line data set to the second ECC engine.

Example 16: The method of example 12, wherein: the SA line data set that corresponds to the DQ signal lines is received via a buffer coupled between the memory array and the memory controller: the even SA line data set is provided to the first ECC engine via a first buffer coupled between ECC circuitry of the memory controller and the first ECC engine: or the odd SA line data set is provided to the second ECC engine via a second buffer coupled between the ECC circuitry of the memory controller and the second ECC engine.

Example 17: A memory module comprising: a memory bank of multiple memory dies: an interface operably coupled with respective sense amplifier (SA) lines of the memory bank: and a controller that is coupled to the interface, the controller comprising error correction code (ECC) circuitry configured to, for a set of data input/output (DQ) lines of the memory bank; receive a data set for the SA lines that comprises an even SA line data set: receive a data set for the SA lines that comprises an odd SA line data set: provide the even SA line data set to a first ECC engine: provide the odd SA line data set to a second ECC engine; receive a first ECC determination from the first ECC engine: receive a second ECC determination from the second ECC engine: and correct a bit error in the even SA line data set based on the first ECC determination: or correct a bit error in the odd SA line data set based on the second ECC determination.

Example 18: The memory module of example 17, wherein the ECC circuitry of the controller is further configured to: correct the bit error in the even SA line data set based on the first ECC determination; and correct the bit error in the odd SA line data set based on the second ECC determination.

Example 19: The memory module of example 17, wherein: the bit error in the even SA line data set is associated with a first SA line of the SA lines of the memory bank: and the bit error in the odd SA line data set is associated with a second SA line of the SA lines of the memory bank that is adjacent to the first SA line of the memory bank.

Example 20: The memory module of example 17, wherein the memory module is configured as a Compute Express Link (CXL) memory module, a single in-line memory module (SIMM), a dual in-line memory module (DIMM), or a small outline DIMM (SO-DIMM).

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B." or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although implementations for system ECC circuitry routing have been described in language specific to certain features and/or methods, the subject of the appended claims is not limited to the specific features or methods described. Rather, the specific features and methods are disclosed as example implementations for system ECC circuitry routing.

What is claimed is:

1. An apparatus comprising:
   a memory array comprising multiple memory banks;
   an interface operably coupled with respective sense amplifier (SA) lines of the multiple memory banks; and
   a controller that is coupled to the interface, the controller comprising:
   error correction code (ECC) circuitry configured to, for respective sets of data input/output (DQ) lines of a first memory bank and a second memory bank of the multiple memory banks:
      receive, from the first memory bank, respective data sets for SA lines that comprise a first even SA line data set and a first odd SA line data set;
      receive, from the second memory bank, respective data sets for SA lines that comprise a second even SA line data set and a second odd SA line data set;

provide the first even SA line data set of the first memory bank and the second even SA line data set of the second memory bank to a first ECC engine;
      provide the first odd SA line data set of the first memory bank and the second odd SA line data set of the second memory bank to a second ECC engine;
      receive a first ECC determination from the first ECC engine;
      receive a second ECC determination from the second ECC engine; and
      correct, based on the first ECC determination, a bit error in the first even SA line data set of the first memory bank or the second even SA line data set of the second memory bank; or
      correct, based on the second ECC determination, a bit error in the first odd SA line data set or the second odd SA line data set based on the second ECC determination.

2. The apparatus of claim 1, wherein the ECC circuitry includes the first ECC engine and the second ECC engine.

3. The apparatus of claim 1, wherein the ECC circuitry of the controller is further configured to:
   correct the bit error in the first even SA line data set or the second even SA line data set based on the first ECC determination; and
   correct the bit error in the first odd SA line data set or the second odd SA line data set based on the second ECC determination.

4. The apparatus of claim 3, wherein:
   the bit error in the first even SA line data set is associated with a first SA line of the SA lines of the first memory bank, and the bit error in the first odd SA line data set is associated with a second SA line of the SA lines of the first memory bank that is adjacent to the first SA line of the first memory bank; or
   the bit error in the second even SA line data set is associated with a third SA line of the SA lines of the second memory bank, and the bit error in the second odd SA line data set is associated with a fourth SA line of the SA lines of the second memory bank that is adjacent to the third SA line of the second memory bank.

5. The apparatus of claim 1, wherein:
   the first ECC determination indicates that at least one bit error exists in the first even SA line data set, and the second ECC determination indicates that at least one bit error exists in the first odd SA line data set; or
   the first ECC determination indicates that at least one bit error exists in the second even SA line data set, and the second ECC determination indicates that at least one bit error exists in the second odd SA line data set.

6. The apparatus of claim 1, wherein:
   the first ECC engine comprises a first single-bit ECC engine coupled to first even SA lines of the first memory bank and second even SA lines of the second memory bank; and
   the second ECC engine comprises a second single-bit ECC engine coupled to first odd SA lines of the first memory bank and second odd SA lines of the second memory bank.

7. The apparatus of claim 1, wherein:
   the first ECC engine comprises a first multi-bit ECC engine coupled to even SA lines of the multiple memory banks; and
   the second ECC engine comprises a second multi-bit ECC engine coupled to odd SA lines of the multiple memory banks.

8. The apparatus of claim 1, wherein the respective sets of DQ lines of the first memory bank and the second memory bank comprise 16 DQ signals and respective parity data signals of a first channel and a second channel of the memory array.

9. The apparatus of claim 8, wherein the 16 DQ signals and the respective parity data signals of the first channel and the second channel of the multiple memory banks comprise:

a first eight DQ signals and a first parity data signal connected to a first interface die of the first memory bank; and a second eight DQ signals and a second parity data signal connected to a second interface die of the second memory bank.

10. The apparatus of claim 8, wherein the apparatus is configured as a Compute Express Link (CXL) memory module, a single in-line memory module (SIMM), a dual in-line memory module (DIMM), or a small outline DIMM (SO-DIMM).

11. The apparatus of claim 1, wherein the memory array is configured as one of a double data rate (DDR) memory array, DDR2 memory array, DDR3 memory array, DDR4 memory array, DDR5 memory array, synchronous dynamic random-access memory (SDRAM) array, low-power DDR (LPDDR) SDRAM array, LPDDR5 SDRAM array, graphics DDR (GDDR) SDRAM array, or high-bandwidth memory (HBM) array.

12. A method comprising:

receiving, via an interface coupled to sense amplifier (SA) lines of a memory bank and from a first memory die of the memory bank, a first even SA line data set for a set of data input/output (DQ) signal lines of the memory bank;

receiving, via the interface coupled to the SA lines of the memory bank and from a second memory die of the memory bank, a second even SA line data set for the set of DQ signal lines of the memory bank;

receiving, via the interface coupled to the SA lines of a memory bank and from the first memory die, a first odd SA line data set for the set of DQ signal lines of the memory bank;

receiving, via the interface coupled to the SA lines of the memory bank and from the second memory die, a second odd SA line data set for the set of DQ signal lines of the memory bank;

providing the first even SA line data set of the first memory die and the second even SA line data set of the second memory die to a first error correction code (ECC) engine of a memory controller;

providing the first odd SA line data set of the first memory die and the second odd SA line data set of the second memory die to a second ECC engine of the memory controller;

receiving a first ECC determination from the first ECC engine based on the first even SA line data set and the second even SA line data set;

receiving a second ECC determination from the second ECC engine based on the first odd SA line data set and the second odd SA line data set; and detecting, based on the first ECC determination, a bit error in the first even SA line data set or the second even SA line data set; or detecting, based on the second ECC determination, a bit error in the first odd SA line data set or the second odd SA line data set based on the second ECC determination.

13. The method of claim 12, further comprising:

correcting the bit error in the first even SA line data set or the second even SA line data set based on the first ECC determination; and correcting the bit error in the first odd SA line data set or the second odd SA line data set based on the second ECC determination.

14. The method of claim 13, wherein:

the bit error in the first even SA line data set is associated with a first SA line of the SA lines of the memory bank, and the bit error in the first odd SA line data set is associated with a second SA line of the SA lines of the memory bank that is adjacent to the first SA line of the memory bank; or the bit error in the second even SA line data set is associated with a third SA line of the SA lines of the memory bank, and the bit error in the second odd SA line data set is associated with a fourth SA line of the SA lines of the memory bank that is adjacent to the third SA line of the memory bank.

15. The method of claim 12, wherein:

the first even SA line data set, the second even SA line data set, the first odd SA line data set, and the second odd SA line data set are received as an SA line data set that corresponds to the DQ signal lines, and the method further comprises:

apportioning the SA line data set into the first even SA line data set, the second even SA line data set, the first odd SA line data set, and the second odd SA line data set prior to providing the first even SA line data set and the second even SA line data set to the first ECC engine and providing the first odd SA line data set and the second odd SA line data set to the second ECC engine.

16. The method of claim 12, wherein:

the first even SA line data set is provided to the first ECC engine via a first buffer coupled between ECC circuitry of the memory controller and the first ECC engine;

the second even SA line data set is provided to the first ECC engine via a second buffer coupled between ECC circuitry of the memory controller and the first ECC engine;

the first odd SA line data set is provided to the second ECC engine via the first buffer coupled between ECC circuitry of the memory controller and the first ECC engine; and the second odd SA line data set is provided to the second ECC engine via the second buffer coupled between the ECC circuitry of the memory controller and the second ECC engine.

17. A memory module comprising:

a memory bank of multiple memory dies;

an interface operably coupled with respective sense amplifier (SA) lines of the memory bank; and a controller that is coupled to the interface, the controller comprising error correction code (ECC) circuitry configured to, for a set of data input/output (DQ) lines of the memory bank:

receive, from a first memory die of the multiple memory dies, a first data set for the SA lines that comprises a first even SA line data set and a first odd SA line data set;

receive, from a second memory die of the multiple memory dies, a second data set for the SA lines that comprises a second even SA line data set and a second odd SA line data set;

provide the first even SA line data set of the first memory die and the second even SA line data set of the second memory die to a first ECC engine;

provide the first odd SA line data set of the first memory die and the second odd SA line data set of the second memory die to a second ECC engine;

receive a first ECC determination from the first ECC engine based on the first even SA line data set and the second even SA line data set;

receive a second ECC determination from the second ECC engine based on the first odd SA line data set and the second odd SA line data set; and correct, based on the first ECC determination, a bit error in at least one of the first even SA line data set and the second even SA line data set; or correct, based on the second ECC determination, a bit error in at least one of the first odd SA line data set and the second odd SA line data set based on the second ECC determination.

18. The memory module of claim 17, wherein the ECC circuitry of the controller is further configured to:

correct the bit error in the first even SA line data set or the second even SA line data set based on the first ECC determination; and correct the bit error in the first odd SA line data set or the second odd SA line data set based on the second ECC determination.

19. The memory module of claim 17, wherein:

the bit error in the first even SA line data set is associated with a first SA line of the SA lines of the memory bank, and the bit error in the first odd SA line data set is associated with a second SA line of the SA lines of the memory bank that is adjacent to the first SA line of the memory bank; or the bit error in the second even SA line data set is associated with a third SA line of the SA lines of the memory bank, and the bit error in the second odd SA line data set is associated with a fourth SA line of the SA lines of the memory bank that is adjacent to the third SA line of the memory bank.

20. The memory module of claim 17, wherein the memory module is configured as a Compute Express Link (CXL) memory module, a single in-line memory module (SIMM), a dual in-line memory module (DIMM), or a small outline DIMM (SO-DIMM).

\* \* \* \* \*